(12) United States Patent
Jinbo et al.

(10) Patent No.: US 8,049,215 B2
(45) Date of Patent: Nov. 1, 2011

(54) THIN FILM TRANSISTOR

(75) Inventors: Yasuhiro Jinbo, Kanagawa (JP); Tomokazu Yokoi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 273 days.

(21) Appl. No.: 12/426,983

(22) Filed: Apr. 21, 2009

(65) Prior Publication Data

US 2009/0267067 A1     Oct. 29, 2009

(30) Foreign Application Priority Data

Apr. 25, 2008  (JP) ................................ 2008-115357

(51) Int. Cl.
 *H01L 29/786* (2006.01)
(52) U.S. Cl. ........ 257/57; 257/59; 257/72; 257/E29.294
(58) Field of Classification Search ............ 257/57, 257/59, 72, E29.273, E29.291, E29.292, 257/E29.294
See application file for complete search history.

(56) References Cited

U.S. PATENT DOCUMENTS

| | | | |
|---|---|---|---|
| 4,409,134 A | 10/1983 | Yamazaki | |
| 5,101,242 A | 3/1992 | Ikeda et al. | |
| 5,221,631 A | 6/1993 | Ikeda et al. | |
| 5,311,040 A * | 5/1994 | Hiramatsu et al. | 257/57 |
| 5,591,987 A | 1/1997 | Yamazaki et al. | |
| 5,677,236 A | 10/1997 | Saitoh et al. | |
| 5,864,150 A | 1/1999 | Lin | |
| 6,153,893 A | 11/2000 | Inoue et al. | |
| 6,468,839 B2 | 10/2002 | Inoue et al. | |
| 6,483,124 B2 * | 11/2002 | Flewitt | 257/59 |
| 7,511,709 B2 | 3/2009 | Koyama et al. | |
| 7,635,889 B2 | 12/2009 | Isa et al. | |
| 7,786,485 B2 | 8/2010 | Dairiki et al. | |
| 7,812,348 B2 | 10/2010 | Dairiki et al. | |
| 7,821,012 B2 | 10/2010 | Jinbo | |

(Continued)

FOREIGN PATENT DOCUMENTS

EP     0 535 979 A2     4/1993

(Continued)

OTHER PUBLICATIONS

Arai, et al., "41.2: Micro Silicon Technology for Active Matrix OLED Display", SID Digest '07, SID International Symposium Digest of Technical Papers, vol. XXXVIII, pp. 1370-1373, 2007.

(Continued)

*Primary Examiner* — Victor A Mandala
*Assistant Examiner* — Scott Stowe
(74) *Attorney, Agent, or Firm* — Nixon Peabody LLP; Jeffrey L. Costellia

(57) ABSTRACT

A thin film transistor has a gate electrode; a gate insulating layer provided so as to cover the gate electrode layer; a pair of impurity semiconductor layers forming source and drain regions which is provided so that at least part of each of them overlaps the gate electrode layer and which are provided with a space therebetween; a microcrystalline semiconductor layer provided over the gate insulating layer in part of a channel length; a semiconductor layer provided over the gate insulating layer so as to cover at least the microcrystalline semiconductor layer; and an amorphous semiconductor layer provided between the semiconductor layer and the pair of impurity semiconductor layers. An impurity element which reduces the coordination number of silicon and generates dangling bonds is made to exist in the semiconductor layer.

28 Claims, 10 Drawing Sheets

U.S. PATENT DOCUMENTS

| | | |
|---|---|---|
| 2005/0115930 A1 | 6/2005 | Tanaka et al. |
| 2009/0033818 A1 | 2/2009 | Nakajima et al. |
| 2009/0057683 A1 | 3/2009 | Nakajima et al. |
| 2009/0061574 A1 | 3/2009 | Nakajima et al. |
| 2009/0218568 A1 | 9/2009 | Dairiki et al. |
| 2009/0236600 A1* | 9/2009 | Yamazaki et al. ............ 257/59 |
| 2009/0261328 A1 | 10/2009 | Miyairi et al. |
| 2009/0261330 A1 | 10/2009 | Yamazaki et al. |
| 2009/0267068 A1 | 10/2009 | Dairiki et al. |
| 2010/0096631 A1 | 4/2010 | Miyairi et al. |
| 2010/0096637 A1 | 4/2010 | Yamazaki et al. |

FOREIGN PATENT DOCUMENTS

| | | |
|---|---|---|
| EP | 0 652 595 B1 | 5/1995 |
| EP | 1 537 938 A2 | 6/2005 |
| JP | 05-129608 | 5/1993 |
| JP | 07-131030 | 5/1995 |
| JP | 2001-053283 | 2/2001 |
| JP | 2005-049832 | 2/2005 |
| JP | 2005-191546 | 7/2005 |

OTHER PUBLICATIONS

Fujiwara, et al., "Stress-Induced Nucleation of Microcrystalline Silicon From Amorphous Phase", Jpn. J. Appl. Phys., vol. 41/Part1, No. 5A, pp. 2821-2828, 2002.

Kamei et al., "A Significant Reduction of Impurity Contents in Hydrogenated Microcrystalline Silicon Films for Increased Grain Size and Reduced Defect Density", Jpn. J. Appl. Phys., vol. 37/Part2, No. 3A, pp. L 265-L 268, Mar. 1, 1998.

Lee, et al., "How to Achieve High Mobility Thin Film Transistors by Direct Deposition of Silicon Using 13.56 MHz RF PECVD?", Int. Electron Devices Meeting Tech. Digest, pp. 295-298, 2006.

Czang, et al., "Directly Deposited Nanocrystalline Silicon Thin-Film Transistors With Ultra High Mobilities", Appl. Phys. Lett., 89, 2006, pp. 252101-1-252101-3.

Fujiwara, et al., "Real-Time Spectroscopic Ellipsometry Studies of the Nucleation and Grain Growth Processes in Microcrystalline Silicon Thin Films", Physical Review B, vol. 63, pp. 115306-1-115306-9, 2001.

Fujiwara, et al., "Microcrystalline Silicon Nucleation Sites in the Sub-Surface of Hydrogenated Amorphous Silicon", Surface Science 497, pp. 333-340, 2002.

Kim et al., "42.1: A Novel Four-Mask-Count Process Architecture for TFT-LCDs", SID Digest '00 :SID International Symposium Digest of Technical Papers, pp. 1006-1009, 2000.

Song, et al., "34.1: Advanced Four-Mask Process Architecture for the a-Si TFT, Array Manufacturing Method", SID Digest '02 :SID International Symposium Digest of Technical Papers, pp. 1038-1041, 2002.

Choi et al., "P-16: Novel Four-Mask Process in the FFS TFT-LCD With Optimum Multiple-Slit Design Applied by the Use of a Gray-Tone Mask", SID Digest '05 :SID International Symposium Digest of Technical, pp. 284-287, 2005.

* cited by examiner

THIN FILM TRANSISTOR

BACKGROUND OF THE INVENTION

1. Field of the Invention

The present invention relates to thin film transistors.

2. Description of the Related Art

As one type of field effect transistor, a thin film transistor in which a semiconductor layer which is provided over a substrate having an insulating surface is used for a channel formation region is known. For the semiconductor layer used in the thin film transistor, techniques using amorphous silicon, microcrystalline silicon, and polycrystalline silicon are disclosed (see Patent Documents 1 to 5). Thin film transistors have been used for, for example, liquid crystal television devices and have been put to practical use as switching transistors of pixels which form a display screen.

[Patent Document 1] Japanese Published Patent Application No. 2001-053283

[Patent Document 2] Japanese Published Patent Application No. 05-129608

[Patent Document 3] Japanese Published Patent Application No. 2005-049832

[Patent Document 4] Japanese Published Patent Application No. 07-131030

[Patent Document 5] Japanese Published Patent Application No. 2005-191546

SUMMARY OF THE INVENTION

A thin film transistor in which an amorphous silicon layer is used for a channel formation region has low field effect mobility (approximately 0.4 $cm^2/V \cdot sec$ to 0.8 $cm^2/V \cdot sec$) and low on current. On the other hand, a thin film transistor in which a microcrystalline silicon layer is used for a channel formation region has higher field effect mobility than the thin film transistor using an amorphous silicon layer and high off current which is increased with on current; thus, sufficient switching characteristics cannot be obtained.

A thin film transistor in which a polycrystalline silicon layer is used for a channel formation region has characteristics such as much higher field effect mobility and higher on current than the above-described two types of thin film transistors. Because of such characteristics, the thin film transistor in which a polycrystalline silicon layer is used for a channel formation region can be used not only as a switching transistor provided in a pixel but also as a transistor included in a driver circuit for which high speed operation is required.

However, a step of crystallizing a semiconductor layer is needed in a manufacturing process of the thin film transistor in which a polycrystalline silicon layer is used for a channel formation region; thus, the thin film transistor has a problem of high manufacturing cost as compared to manufacturing processes of the above-described thin film transistor using an amorphous silicon layer and thin film transistor using a microcrystalline silicon layer. Further, when laser annealing is employed for crystallizing the semiconductor layer, an area irradiated with a laser beam is small, and thus a liquid crystal panel having a large screen cannot be efficiently produced.

Glass substrates used for manufacturing display panels have been increased in size every year, started from the first generation (e.g., 320 mm×400 mm) to the eighth generation (e.g., 2200 mm×2400 mm) today. It is predicted that glass substrates will be further increased in size from now on, such as the ninth generation (e.g., 2400 mm×2800 mm, 2450 mm×3050 mm) and the tenth generation (e.g., 2950 mm×3400 mm). However, no technique has been established yet which is capable of manufacturing a thin film transistor capable of high speed operation (e.g., the above-described thin film transistor in which a polycrystalline silicon layer is used) over such a large-size glass substrate with high productivity. As the technique by which a thin film transistor capable of high speed operation is manufactured over a large-size substrate, a technique of manufacturing a thin film transistor in which microcrystalline silicon is used for a channel formation region has been advanced; however, enough characteristics of the thin film transistor have not been obtained yet.

An object of an embodiment of the present invention is to provide a thin film transistor in which the above-described problems regarding on current and off current of the thin film transistor are solved. Another object of an embodiment of the present invention is to provide a thin film transistor capable of high speed operation.

An embodiment of the present invention is a thin film transistor which has a gate electrode layer; a gate insulating layer which is provided so as to cover the gate electrode layer; a pair of impurity semiconductor layers forming a source region and a drain region which is provided so that at least part of each of the pair of impurity semiconductor layers overlaps the gate electrode layer and which are provided with a space therebetween; a microcrystalline semiconductor layer which is provided over the gate insulating layer in part of a channel length; a semiconductor layer which is provided over the gate insulating layer so as to cover at least the microcrystalline semiconductor layer; and an amorphous semiconductor layer which is provided between the semiconductor layer and the pair of impurity semiconductor layers, where the semiconductor layer includes a plurality of crystalline regions existing in a dispersed manner in an amorphous structure.

Another embodiment of the present invention is a thin film transistor which has a gate electrode layer; a gate insulating layer which is provided so as to cover the gate electrode layer; a pair of impurity semiconductor layers forming a source region and a drain region which is provided so that at least part of each of the pair of impurity semiconductor layers overlaps the gate electrode layer and which are provided with a space therebetween; a microcrystalline semiconductor layer which is provided over the gate insulating layer in part of a channel length so that at least part of the microcrystalline semiconductor layer overlaps the gate electrode layer and one of the pair of impurity semiconductor layers and the microcrystalline semiconductor layer does not overlap the other impurity semiconductor layer; a semiconductor layer which is provided over the gate insulating layer so as to cover at least the microcrystalline semiconductor layer; and an amorphous semiconductor layer which is provided between the semiconductor layer and the pair of impurity semiconductor layers, where the semiconductor layer includes a plurality of crystalline regions existing in a dispersed manner in an amorphous structure.

Another embodiment of the present invention is a thin film transistor which has a gate electrode layer; a gate insulating layer which is provided so as to cover the gate electrode layer; a semiconductor layer which is provided over the gate insulating layer so that at least part of the semiconductor layer is in contact with the gate insulating layer; an amorphous semiconductor layer which is provided over the semiconductor layer; a pair of impurity semiconductor layers forming a source region and a drain region which is provided over the amorphous semiconductor layer with a space therebetween; and a microcrystalline semiconductor layer which is provided between the gate insulating layer and the amorphous semiconductor layer in part of a channel length so that at least part of the microcrystalline semiconductor layer overlaps the gate electrode layer and one of the pair of impurity semiconductor layers and the microcrystalline semiconductor layer does not overlap the other impurity semiconductor layer and so that the microcrystalline semiconductor layer is covered with the semiconductor layer, where the semiconductor layer includes a plurality of crystalline regions existing in a dispersed manner in an amorphous structure.

Another embodiment of the present invention is a thin film transistor which has a gate electrode layer; a gate insulating layer which is provided so as to cover the gate electrode layer; a microcrystalline semiconductor layer which is provided over the gate insulating layer so that at least part of the microcrystalline semiconductor layer overlaps the gate electrode layer; an amorphous semiconductor layer which is provided so as to cover at least the microcrystalline semiconductor layer; a pair of impurity semiconductor layers forming a source region and a drain region which is provided over the amorphous semiconductor layer so that one of the pair of impurity semiconductor layers overlaps the microcrystalline semiconductor layer and the other impurity semiconductor layer does not overlap the microcrystalline semiconductor layer; and a semiconductor layer which is provided over the gate insulating layer so as to cover at least the microcrystalline semiconductor layer, where the semiconductor layer includes a plurality of crystalline regions existing in a dispersed manner in an amorphous structure.

In the above-described structures of the embodiments of the present invention, the microcrystalline semiconductor layer preferably includes an impurity element (e.g., phosphorus) which serves as a donor.

In the above-described structures of the embodiments of the present invention, each of the plurality of crystalline regions preferably has an inverted-conical or inverted-pyramidal structure, which grows substantially radially in the direction in which the semiconductor layer is deposited, from a position away from an interface between the gate insulating layer and the semiconductor layer, in a region which does not reach the pair of impurity semiconductor layers.

In the above-described structures of the embodiments of the present invention, the semiconductor layer contains, in the vicinity of the interface with the gate insulating layer, a first impurity element which reduces the coordination number of a semiconductor and generates dangling bonds and a second impurity element which is less likely to generate dangling bonds than the first impurity element. The concentration of the first impurity element is preferably smaller than that of the second impurity element by one digit.

In the above-described structures of the embodiments of the present invention, oxygen is given as the first impurity element and nitrogen is given as the second impurity element.

In the above-described structures of the embodiments of the present invention, the concentration of nitrogen in the semiconductor layer preferably decreases monotonously from the side in contact with the gate insulating layer to the side in contact with the amorphous semiconductor layer.

In the above-described structures of the embodiments of the present invention, an amorphous silicon layer is given as the amorphous semiconductor layer.

In general thin film transistors, flow of carriers (electrons or holes) between a source region and a drain region is controlled by voltage which is applied to a gate electrode (electric potential difference between the gate electrode and the source region), and the carriers flow throughout a semiconductor layer from the source region to the drain region. However, in the thin film transistors of the embodiments of the present invention, carriers which flow between a source region and a drain region flow throughout the microcrystalline semiconductor layer which is provided so as to overlap the gate electrode layer and throughout the amorphous semiconductor layer which is provided so as to extend from over the microcrystalline semiconductor layer in a channel length direction.

In the thin film transistors having the above-described structures of the embodiments of the present invention, the microcrystalline semiconductor layer does not extend through an entire region of the channel length of the thin film transistor but is provided only in part of the channel length, which is formed of an amorphous semiconductor layer. That is, in the thin film transistors of the embodiments of the present invention, carriers which flow between channels flow in the amorphous semiconductor layer for a certain distance in a channel length direction between a source region and a drain region.

In a region, in which carriers flow, of the thin film transistors having the above-described structures of the embodiments of the present invention, it is preferable that a silicon nitride layer be provided below and in contact with the semiconductor layer and a silicon oxynitride layer be provided below and in contact with only the microcrystalline semiconductor layer in order to avoid two problems described below.

The first problem is as follows: when silicon oxynitride is used for a gate insulating layer which is in contact with an amorphous semiconductor layer, threshold voltage of a transistor shifts to a positive electric potential side, and further subthreshold swing (also referred to as an "S value") is increased.

The second problem is as follows: when a microcrystalline semiconductor layer is formed over a silicon nitride layer, the microcrystalline semiconductor layer is easily peeled, which results in difficulty in forming the microcrystalline semiconductor layer.

In the thin film transistors having the above-described structures of the embodiments of the present invention, the concentration of a donor of the microcrystalline semiconductor layer is preferably made as high as possible. The concentration of the donor of the microcrystalline semiconductor layer may be, for example, greater than or equal to $1\times10^{16}$ $cm^{-3}$ and less than or equal to $5\times10^{18}$ $cm^{-3}$. When the concentration of the donor of the microcrystalline semiconductor layer is increased, field effect mobility can be increased, and thus high speed operation becomes possible.

Note that in this specification, silicon oxynitride contains more oxygen than nitrogen, and in the case where measurements are conducted using Rutherford backscattering spectrometry (RBS) and hydrogen forward scattering (HFS), silicon oxynitride preferably contains oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide contains more nitrogen than oxygen, and in the case where measurements are conducted using RBS and HFS, silicon nitride oxide preferably contains oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Note that in this specification, the electric conductivity of the microcrystalline semiconductor layer is preferably greater than or equal to $1\times10^{-5}$ $S\cdot cm^{-1}$ and less than or equal to $5\times10^{-2}$ $S\cdot cm^{-1}$, and the electric conductivity of the amorphous semiconductor layer is lower than that of the microcrystalline semiconductor layer, The pair of microcrystalline semiconductor layers extends at least in part of the channel length of the thin film transistor and generates high on current by having the above-described electric conductivity. On the other hand, the amorphous semiconductor layer which forms part of a channel formation region and a so-called offset region contributes to reduction in off current.

Note that in this specification, an "impurity semiconductor" refers to a semiconductor to which the majority of carriers contributing to electric conduction are supplied by an impurity element imparting one conductivity type which is added to the semiconductor. The impurity element imparting one conductivity type can be a donor or an acceptor; as a donor, elements belonging to Group 15 of the periodic table are typically given, and as an acceptor, elements belonging to Group 13 of the periodic table are typically given. In order to increase the mobility of the carriers in the microcrystalline semiconductor layer, an impurity element which serves as a donor is preferably added.

Note that a microcrystalline semiconductor refers to a semiconductor, the crystal grain diameter of which is, for example, greater than or equal to 2 nm and less than or equal to 200 nm, preferably greater than or equal to 10 nm and less than or equal to 80 nm, more preferably greater than or equal to 20 nm and less than or equal to 50 nm; and the electric conductivity of which is preferably about $10^{-7}$ S·cm$^{-1}$ to 104 S·cm$^{-1}$, which can be increased to approximately $10^1$ S·cm$^{-1}$ by valence control. However, in another embodiment of the present invention, the concepts of the microcrystalline semiconductor are not limited to only the above-described crystal grain diameters and values of the electric conductivity. Concepts of microcrystalline semiconductors are not necessarily limited to the above-described grain diameters and the like as long as the microcrystalline semiconductors have similar physical property values.

Note that "on current" refers to current which flows between a source region and a drain region, that is, in a channel formation region, when an appropriate gate voltage is applied to a gate electrode so that current flows in the channel formation region (that is, when the thin film transistor is on). Note that "on" here refers to a state in which gate voltage (electric potential difference between the source region and the gate electrode, based on the electric potential of the source region) exceeds threshold voltage of the transistor.

In addition, "off current" refers to current which flows between a source region and a drain region, that is in a channel formation region, when gate voltage of the thin film transistor is lower than threshold voltage thereof (that is, when the thin film transistor is of). Note that "off" here refers to a state in which gate voltage (electric potential difference between the source region and a gate electrode, based on the electric potential of the source region) is lower than the threshold voltage of the transistor.

In any of the embodiments of the present invention, the microcrystalline semiconductor layer is not extend through an entire region in the channel length direction of the thin film transistor but is provided in part of the channel formation region so that carriers flow in the amorphous semiconductor layer for a certain distance in the channel formation region. Accordingly, a thin film transistor having high on current, low off current, and excellent switching characteristics can be obtained.

In any of the embodiments of the present invention, by provision of a silicon oxynitride layer as the insulating layer in contact with the microcrystalline semiconductor layer, a thin film transistor having a microcrystalline semiconductor layer with high crystallinity can be obtained.

In any of the embodiments of the present invention, by provision of a silicon nitride layer as the insulating layer in contact with the amorphous semiconductor layer and provision of a silicon oxynitride layer as the insulating layer in contact with the microcrystalline semiconductor layer, a thin film transistor having excellent electric characteristics such as low subthreshold swing and subthreshold voltage which does not shift or small subthreshold voltage shift can be obtained.

BRIEF DESCRIPTION OF THE DRAWINGS

FIGS. 1A and 1B are views each illustrating an example of a structure of a thin film transistor;

FIGS. 6A-1 to 6B-2 are views illustrating examples of methods for manufacturing a thin film transistor;

DETAILED DESCRIPTION OF THE INVENTION

Figure 1A:
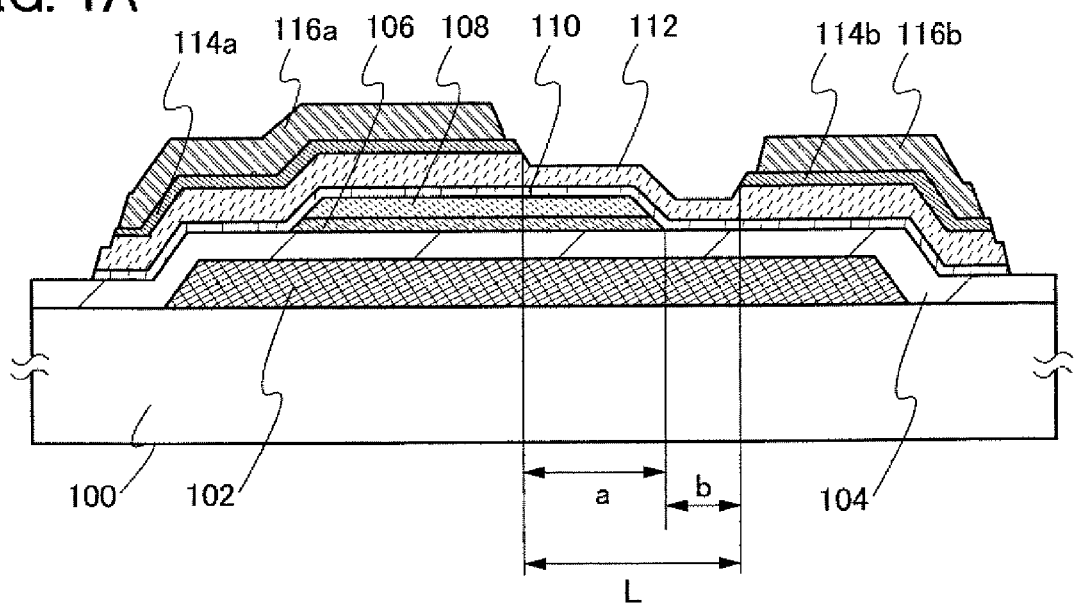

An embodiment and an example of the present invention will be hereinafter described in detail with reference to the accompanying drawings. Note that it is easily understood by those skilled in the art that the modes and details of the present invention can be modified in a variety of ways without departing from the spirit and scope of the present invention. Therefore, the present invention should not be construed as being limited to the description below of the embodiment and example. Note that reference numerals indicating the same portions are used in common in all drawings for describing structures of the present invention with reference to the drawings. Further, in some cases, the same hatching patterns are applied to similar parts, and the similar parts are not particularly denoted by reference numerals.

Embodiment

An example of a structure of a thin film transistor which is an embodiment of the present invention will be described with reference to drawings.

A thin film transistor illustrated in FIG. 1A has a gate electrode layer 102 which is provided over a substrate 100; a gate insulating layer 104 which is provided so as to cover the gate electrode layer 102; an impurity semiconductor layer 114a and an impurity semiconductor layer 114b forming a source region and a drain region which are provided so that at least part of each of the impurity semiconductor layers 114a and 114b overlaps the gate electrode layer 102 and which are provided with a space therebetween; a microcrystalline semiconductor layer 106 which is provided over the gate insulating layer 104 in part of a channel length; a semiconductor layer 110 which is provided over the gate insulating layer 104 so as to cover at least the microcrystalline semiconductor layer 106; and an amorphous semiconductor layer 112 which is provided between the semiconductor layer 110 and the impurity semiconductor layers 114a and 114b.

Specifically, the thin film transistor illustrated in FIG. 1A has the gate electrode layer 102 which is provided over the substrate 100; the gate insulating layer 104 which is provided so as to cover the gate electrode layer 102; the impurity semiconductor layer 114a and the impurity semiconductor layer 114b forming a source region and a drain region which are provided so that at least part of each of the impurity semiconductor layers 114a and 114b overlaps the gate electrode layer 102 and which are provided with a space therebetween; the microcrystalline semiconductor layer 106 which is provided over the gate insulating layer 104 in part of a channel length so that at least part of the microcrystalline semiconductor layer 106 overlaps the gate electrode layer 102 and the impurity semiconductor layer 114a and the microcrystalline semiconductor layer does not overlap the impurity semiconductor layer 114b; the semiconductor layer 110 which is provided over the gate insulating layer 104 so as to cover at least the microcrystalline semiconductor layer 106; and the amorphous semiconductor layer 112 which is provided between the semiconductor layer 110 and the impurity semiconductor layers 114a and 114b.

In other words, the thin film transistor illustrated in FIG. 1A has the gate electrode layer 102 which is provided over the substrate 100; the gate insulating layer 104 which is provided so as to cover the gate electrode layer 102; the semiconductor layer 110 which is provided over the gate insulating layer 104 so that part of the semiconductor layer 110 is in contact with the gate insulating layer 104; the amorphous semiconductor layer 112 which is provided over the semiconductor layer 110; the impurity semiconductor layer 114a and the impurity semiconductor layer 114b forming a source region and a drain region which are provided over the amorphous semiconductor layer 112 with a space therebetween; and the microcrystalline semiconductor layer 106 which is provided between the gate insulating layer 104 and the amorphous semiconductor layer 112 in part of a channel length so that at least part of the microcrystalline semiconductor layer 106 overlaps the gate electrode layer 102 and the impurity semiconductor layer 114a and the microcrystalline semiconductor layer 106 does not overlap the impurity semiconductor layer 114b.

Furthermore, in other words, the thin film transistor illustrated in FIG. 1A has the gate electrode layer 102 which is provided over the substrate 100; the gate insulating layer 104 which is provided so as to cover the gate electrode layer 102; the microcrystalline semiconductor layer 106 which is provided over the gate insulating layer 104 so that at least part of the microcrystalline semiconductor layer 106 overlaps the gate electrode layer 102; the amorphous semiconductor layer 112 which is provided so as to cover at least the microcrystalline semiconductor layer 106; the impurity semiconductor layer 114a and the impurity semiconductor layer 114b forming a source region and a drain region which are provided over the amorphous semiconductor layer 112 so that one of the impurity semiconductor layers 114a and 114b overlaps the microcrystalline semiconductor layer 106 and the other impurity semiconductor layer does not overlap the microcrystalline semiconductor layer 106; and the semiconductor layer 110 which is provided over the gate insulating layer 104 so as to cover at least the microcrystalline semiconductor layer 106.

Note that, although a buffer layer 108 is provided over the microcrystalline semiconductor layer 106 in FIG. 1A as a preferable mode, the buffer layer 108 is not necessarily provided. In the case where the buffer layer 108 is not provided, a process is simplified, and thus throughput is increased.

Further, a wiring layer 116a and a wiring layer 116b are provided over and in contact with the impurity semiconductor layer 114a and the impurity semiconductor layer 114b, respectively. However, without limitation to the structure, part of the wiring layer 116a may be in contact with parts of the semiconductor layer 110 and the amorphous semiconductor layer 112. The mode of that case is illustrated in FIG. 1B. Note that layers illustrated in FIG. 1B are the same as those in FIG. 1A as long as the layers are denoted by the same reference numerals as in FIG. 1A. The thin film transistor illustrated in FIG. 1A can be manufactured using, for example, a multi-tone mask. In the case where a multi-one mask is not used, the thin film transistor illustrated in FIG. 1B can be manufactured.

Each layer in the thin film transistor illustrated in FIG. 1A will be described below.

The substrate 100 can be a plastic substrate with heat resistance which can resist a process temperature in the manufacturing process, or the like, in addition to a glass substrate, a ceramic substrate, or the like. Further, if a light-transmitting property is not needed for the substrate, substrates made of stainless steel and the like with their surfaces provided with an insulating layer may be used. As a glass substrate, for example, substrates made of non-alkali glass such as barium borosilicate glass, aluminoborosilicate glass, and aluminosilicate glass may be used.

The gate electrode layer 102 may be formed to have a single layer or a stacked layer of a metal material such as molybdenum, titanium, chromium, tantalum, tungsten, aluminum, copper, neodymium, or scandium, or an alloy material which includes any of those metal materials as its main component. The gate electrode layer 102 may be formed to a thickness of approximately greater than or equal to 50 nm and less than or equal to 500 nm. The gate electrode layer 102 can be formed in such a manner that a conductive layer is formed over the substrate 100, using the above-described material by a sputtering method or a vacuum evaporation method; a resist mask is formed over the conductive layer by photolithography or the like; and the conductive layer is etched using the resist mask. Here, a conductive layer is formed over the substrate 100 and is etched using a resist mask formed using a photomask. In addition, a gate wiring (a scan line) can also be formed at the same time in a step of forming the gate electrode layer 102. Furthermore, a capacitor line included in a pixel portion can also be formed at the same time. Note that the scan line refers to a wiring which selects a pixel and the capacitor line refers to a wiring connected to one of electrodes of a storage capacitor in a pixel.

The gate insulating layer 104 is formed to have a single layer or a stacked layer of silicon nitride, silicon oxynitride, or a silicon nitride oxide by a CVD method, a sputtering method, or the like. When the gate insulating layer 104 is formed using silicon oxynitride, fluctuation in threshold voltage of the transistor can be suppressed. Further, when the gate insulating layer 104 is formed using silicon nitride, subthreshold swing of the thin film transistor can be reduced. In addition, the adhesion force between the substrate 100 and the gate insulating layer 104 can be increased. Moreover, impurity elements such as sodium included in the substrate 100 can be prevented from entering the microcrystalline semiconductor layer 106 and the like. Furthermore, oxidation of the gate electrode layer 102 can be prevented.

The gate insulating layer 104 is preferably formed to a thickness of greater than or equal to 50 nm and less than or equal to 550 nm, more preferably greater than or equal to 50 nm and less than or equal to 300 nm. In particular, in the case where the gate electrode layer 102 is formed by a sputtering method, unevenness is likely to be generated on the surface of the gate electrode layer 102. The above-described thickness makes it possible to suppress reduction in coverage due to the unevenness.

Note that it is preferable that, in a region, in which carriers flow, of the thin film transistor as the gate insulating layer 104, a silicon nitride layer be provided below and in contact with the semiconductor layer 110 and a silicon oxynitride layer be provided only below and in contact with the microcrystalline semiconductor layer 106. That is because when silicon oxynitride is used for a gate insulating layer which is in contact with a layer containing a large number of amorphous semiconductors, threshold voltage of a transistor shifts to a positive electric potential side, and further subthreshold swing (S value) is increased. Further, that is also because when the microcrystalline semiconductor layer is formed over a silicon nitride layer, peeling or the like of the microcrystalline semiconductor layer is likely to be generated, which results in difficulty in forming the microcrystalline semiconductor layer.

The electric conductivity of the microcrystalline semiconductor layer 106 is preferably in the range of 0.9 S·cm$^{-1}$ to 2 S·cm$^{-1}$.

The microcrystalline semiconductor layer 106 may be formed to a thickness of greater than or equal to 5 nm and less than or equal to 50 nm, preferably greater than or equal to 5 nm and less than or equal to 30 nm.

An impurity element imparting one conductivity type (an impurity element which serves as a donor) is preferably added to the microcrystalline semiconductor layer 106 in order to obtain sufficient on current.

The small thickness of the microcrystalline semiconductor layer 106 of greater than or equal to 5 nm and less than or equal to 30 nm, preferably greater than or equal to 10 nm and less than or equal to 20 nm, makes it possible to keep off current of the thin film transistor low. Further, since the amorphous semiconductor layer 112 is provided between the microcrystalline semiconductor layer 106 and the impurity semiconductor layers 114a and 114b, off current of the thin film transistor can be reduced more than in the case of a conventional thin film transistor using a microcrystalline semiconductor layer.

The buffer layer 108 may be formed using an amorphous semiconductor. Alternatively, the buffer layer 108 may be formed using an amorphous semiconductor to which halogen such as fluorine or chlorine is added. The thickness of the buffer layer 108 may be greater than or equal to 30 nm and less than or equal to 200 nm, preferably greater than or equal to 50 nm and less than or equal to 150 nm. As the amorphous semiconductor, amorphous silicon is given. Further, when the buffer layer 108 is formed of an amorphous semiconductor layer, specifically an amorphous semiconductor layer including hydrogen, nitrogen, or halogen, natural oxidation of surfaces of crystal grains included in the microcrystalline semiconductor layer 106 can be prevented. Accordingly, the number of defects by which carriers can be captured or a region which can hinder movement of carriers can be reduced. Thus, high speed operation of the thin film transistor can be achieved and on current can be increased.

The provision of the semiconductor layer 110 whose resistivity is lower than that of the amorphous semiconductor layer 112 between the gate insulating layer 104 and the amorphous semiconductor layer 112 makes it easier for carriers to flow, and thus high speed operation of the thin film transistor is possible.

The amorphous semiconductor layer 112 is preferably formed using amorphous silicon. Further, the amorphous semiconductor layer 112 may include fluorine, chlorine, or the like. In the case where the amorphous semiconductor layer 112 includes phosphorus, the concentration of the phosphorus in the amorphous semiconductor layer 112 is preferably lower than that in the other semiconductor layers. In particular, when phosphorus is included in the amorphous semiconductor layer 112 at a lower concentration than in the microcrystalline semiconductor layer 106, fluctuation in threshold voltage of the transistor can be suppressed. The thickness of the amorphous semiconductor layer 112 which overlaps the wiring is greater than or equal to 50 nm and less than or equal to 500 nm.

The amorphous semiconductor layer 112 is formed so as to cover side surfaces of the microcrystalline semiconductor layer 106. In addition, the amorphous semiconductor layer 112 is formed so as to cover the buffer layer 108. Moreover, in the periphery of the microcrystalline semiconductor layer 106, the gate insulating layer 104 and the amorphous semiconductor layer 112 are in contact with each other. With such a structure, the microcrystalline semiconductor layer 106 is not in contact with the impurity semiconductor layer 114a and the impurity semiconductor layer 114b. Accordingly, leakage current generated between the microcrystalline semiconductor layer 106 and the impurity semiconductor layer 114a and the impurity semiconductor layer 114b can be reduced, and thus off current of the thin film transistor can be reduced.

As an impurity element for example, phosphorus is added to the pair of impurity semiconductor layer 114a and impurity semiconductor layer 114b in the case of manufacturing an n-type thin film transistor, while boron is added in the case of manufacturing a p-type thin film transistor. The impurity semiconductor layer 114a and the impurity semiconductor layer 114b are preferably formed to a thickness of greater than or equal to 10 nm and less than or equal to 100 nm, more preferably greater than or equal to 30 nm and less than or equal to 50 nm.

The wiring layer 116a and the wiring layer 116b are preferably formed using a conductive material, for example, a metal material. For example, the wiring layer 116a and the wiring layer 116b are preferably formed to have a single layer or a stacked layer of aluminum, aluminum to which a heat-resistance-improving element is added or aluminum to which a hillock-preventing element is added (hereinafter those are referred to as an aluminum alloy). Here, as the heat-resistance-improving element or the hillock-preventing element, there are copper, silicon, titanium, neodymium, scandium, molybdenum, and the like. In addition, the wiring layer 116a and the wiring layer 116b each preferably have a stacked layer structure in which a layer formed of titanium, tantalum, molybdenum, or tungsten, or nitride thereof is formed on the side which is in contact with the impurity semiconductor layer 114a or the impurity semiconductor layer 114b, and aluminum or an aluminum alloy is formed thereover. Furthermore, the wiring layer 116a and the wiring layer 116b each preferably have a three-layer structure in which another layer formed of titanium, tantalum, molybdenum, or tungsten, or nitride thereof is further formed over the aluminum or the aluminum alloy.

In the thin film transistor illustrated in FIG. 1A, the amorphous semiconductor layer 112 is not in contact with the wiring layer 116a and the wiring layer 116b, and the wiring layer 116a and the wiring layer 116b are provided over the buffer layer 108 with the pair of impurity semiconductor layers 114a and 114b interposed therebetween. However, as in the thin film transistor illustrated in FIG. 1B, side surfaces of the amorphous semiconductor layer 112 may be in contact with the wiring layer 116a and the wiring layer 116b. Note that the thin film transistor illustrated in FIG. 1A can be manufactured using a multi-tone mask. In the case where a multi-tone mask is not used, the thin film transistor illustrated in FIG. 1B can be manufactured.

Further, in the thin film transistor illustrated in FIG. 1A, a first thin film transistor and a second thin film transistor are connected in series. The first thin film transistor includes the gate electrode layer 102, the gate insulating layer 104, the microcrystalline semiconductor layer 106, the buffer layer 108, the semiconductor layer 110, the amorphous semiconductor layer 112, the impurity semiconductor layer 114a, and the wiring layer 116a. The second thin film transistor includes the gate electrode layer 102, the gate insulating layer 104, the amorphous semiconductor layer 112, the impurity semiconductor layer 114b, and the wiring layer 116b.

The second thin film transistor is a thin film transistor in which the amorphous semiconductor layer is used for a channel formation region. In the first thin film transistor, the microcrystalline semiconductor layer 106 corresponds to a region in which carriers flow. The microcrystalline semiconductor layer 106 has an electric conductivity of 0.9 S·cm$^{-1}$ to 2 S·cm$^{-1}$; therefore, the microcrystalline semiconductor layer 106 has a lower resistivity than a normal amorphous semiconductor layer. Thus, even in a state where positive voltage which is lower than threshold voltage of the second thin film transistor is applied to the gate electrode layer 102, a large number of carriers are induced in the microcrystalline semiconductor layer 106. When positive voltage which is higher than threshold voltage of the second thin film transistor is applied to the gate electrode layer 102, the second thin film transistor is turned on, and the large number of carriers induced in the microcrystalline semiconductor layer 106 flow toward the wiring layer 116a of the first thin film transistor or the wiring layer 116b of the second thin film transistor.

Figure 2:
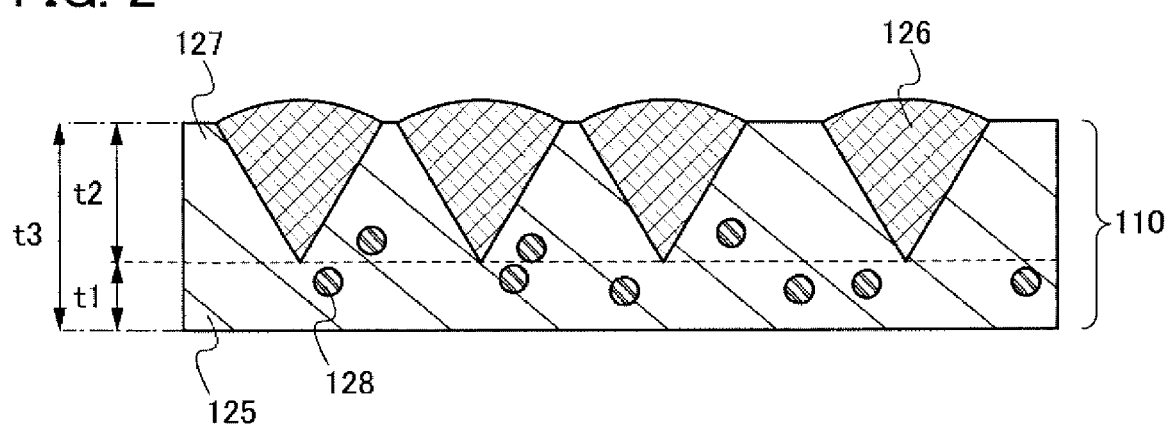
FIG. 2 is a view illustrating an example of a structure of a semiconductor layer 110.

The semiconductor layer 110 includes a first region 125 and a second region 127 (see FIG. 2). The first region 125 has an amorphous structure and minute crystal grains 128. The second region 127 has a plurality of crystal grains 126 existing in a dispersed manner, minute crystal grains 128, and an amorphous structure which fills a space between the plurality of crystal grains 126 and the minute crystal grains 128. The first region 125 is over and in contact with the gate insulating layer 104. The first region 125 has its thickness defined as t1 which is from an interface with the gate insulating layer 104 to an interface with the second region 127. The second region 127 is over and in contact with the first region 125. The second region 127 has its thickness defined as t2. That is, positions where nuclei of the crystal grains 126 are generated are controlled in the thickness direction of the semiconductor layer 110 so that they can be located a distance of t1 away from the interface between the first region 125 and the gate insulating layer 104. The positions where nuclei of the crystal grains 126 are generated are controlled by a concentration of an impurity element suppressing crystallization which is included in the semiconductor layer 110 (e.g., a concentration of nitrogen).

The crystal grain 126 has an inverted-conical or inverted-pyramidal shape. The "inverted conical or inverted pyramidal shape" here refers to a three-dimensional shape and is constructed by (i) a base which is constructed by a plurality of planes and (ii) lines linking the periphery of the base and a vertex which is located outside the base, wherein the vertex exists on a substrate side. In other words, as described in Example below, the "inverted-conical or inverted-pyramidal shape" refers to a shape of the crystal grain 126 which grows substantially radially in a direction in which the semiconductor layer 110 is deposited, from a position away from the interface between the gate insulating layer 104 and the semi-conductor layer 110, in a region which does not reach a source region and a drain region. Each of crystal nuclei generated in a dispersed manner grows along its crystallographic direction during the formation of the semiconductor layer, so that the crystal grains start to grow from the crystal nuclei so as to spread in an in-plane direction of a plane perpendicular to the direction of crystal growth. The semiconductor layer 110 has such crystal grains, whereby on current thereof can be higher than that of an amorphous semiconductor. Further, the crystal grain 126 includes a single crystal or a twin crystal. Here, crystal plane directions of a side surface of the crystal grain 126 having an inverted conical or inverted pyramidal shape are aligned and the side surface (the line that connects the periphery with the vertex) is straight (FIG. 2). Therefore, it can be considered that the crystal grain 126 is more like a form including a single crystal or a twin crystal than a form including a plurality of crystals. In the case of the form including a twin crystal, the number of dangling bonds is small; therefore, the number of defects and the amount of off current are small as compared to the case of the form including a plurality of crystals. Further, the number of grain boundaries is small and the amount of on current is large in the case of the form including a twin crystal as compared to the case of the form including a plurality of crystals. Note that the crystal grain 126 may include a plurality of crystals.

Note that the term "twin crystal" means that two different crystal grains are bonded to each other with highly favorable consistency at a crystal boundary. In other words, the "twin crystal" has a structure in which a trap level due to crystal defects or the like is hardly formed with crystal lattices continuously arranged at a crystal boundary. Thus, it can be considered that a crystal boundary does not substantially exist in a region having such a crystalline structure.

Here, as an impurity element which suppresses generation of crystal nuclei, an impurity element (e.g., nitrogen) which does not generate carrier traps in silicon is selected. On the other hand, a concentration of an impurity element (e.g., oxygen) which reduces the coordination number of silicon and generates dangling bonds is reduced. Therefore, the concentration of oxygen is preferably reduced without reducing the concentration of nitrogen. Specifically, the concentration of oxygen which is measured by secondary ion mass spectrometry is preferably less than or equal to $5\times10^{18}$ cm$^{-3}$.

In addition, in this embodiment, the semiconductor layer 110 is formed while nitrogen is being made to exist on the surface of the gate insulating layer 104. Here, the concentration of nitrogen is important because it determines positions where nuclei are generated. When the semiconductor layer 110 is formed over the gate insulating layer 104 on which nitrogen exists, the first region 125 is formed first, and then the second region 127 is formed. Here, the interface between the first region 125 and the second region 127 is determined by the concentration of nitrogen. Crystal nuclei are generated when the concentration of nitrogen measured by secondary ion mass spectrometry is greater than or equal to $1\times10^{20}$ cm$^{-3}$ and less than or equal to $1\times10^{21}$ cm$^{-3}$, preferably greater than or equal to $2\times10^{20}$ cm$^{-3}$ and less than or equal to $7\times10^{20}$ cm$^{-3}$, and accordingly the second region 127 is formed. That is, in the crystal nuclei generation positions from which the crystal grains 126 start to grow, the concentration of nitrogen measured by secondary ion mass spectrometry is greater than or equal to $1\times10^{20}$ cm$^{-3}$ and less than or equal to $1\times10^{21}$ cm$^{-3}$, preferably greater than or equal to $2\times10^{20}$ cm$^{-3}$ and less than or equal to $7\times10^{20}$ cm$^{-3}$. In other words, the concentration of nitrogen measured by secondary ion mass spectrometry at the vertex of the crystal grain 126 having an inverted-conical or inverted-pyramidal shape is greater than or equal to $1\times10^{20}$ $cm^{-3}$ and less than or equal to $1\times10^{21}$ $cm^{-3}$, preferably greater than or equal to $2\times10^{20}$ $cm^{-3}$ and less than or equal to $7\times10^{20}$ $cm^{-3}$.

Further, the concentration of nitrogen gradually decreases as a distance from the interface with the gate insulating layer 104 increases. The concentration of nitrogen preferably decreases by one digit in the range of a distance of greater than or equal to 25 nm and less than or equal to 40 nm, more preferably in the range of a distance of greater than or equal to 30 nm and less than or equal to 35 nm.

As described above, the crystal grains exist in a dispersed manner. In order that the crystal grains are made to exist in a dispersed manner, it is necessary to control generation density of the crystal nuclei. The generation density of nuclei of the crystal grains can be controlled with the concentration of nitrogen set within the above-described concentration range, whereby the crystal grains can exist in a dispersed manner.

Note that as described above, when the impurity element which suppresses generation of crystal nuclei exist at a high concentration (the concentration of the impurity element measured by secondary ion mass spectrometry is approximately greater than or equal to $1\times10^{20}$ $cm^{-3}$), crystal growth can also be suppressed, and therefore nitrogen to be included in the semiconductor layer 110 is added only to a surface on which the semiconductor layer 110 is to be deposited or introduced at the early stage of deposition of the semiconductor layer 110.

The first region 125 of the semiconductor layer 110 includes an amorphous structure and minute crystal grains 128. In addition, the energy of an Urbach edge measured by a constant photocurrent method (CPM) or photoluminescence spectroscopy and the defect absorption spectrum are small as compared to a conventional amorphous semiconductor layer. Accordingly, the semiconductor layer 110 is a semiconductor layer having a high level of orderliness in which the number of defects is small and a tail slope of a level at a band edge of a valence band is steep, as compared to the conventional amorphous semiconductor. Further, a peak region of spectrum measured by low temperature photoluminescence spectroscopy of the first region 125 of the semiconductor layer 110 is greater than or equal to 1.31 eV and less than or equal to 1.39 eV. Note that a peak region of spectrum measured by low temperature photoluminescence spectroscopy of the microcrystalline semiconductor layer, typically a microcrystalline silicon layer, is greater than or equal to 0.98 eV and less than or equal to 1.02 eV.

Here, the semiconductor layer 110 preferably includes an NH group. The NH group is included in the semiconductor layer 110, whereby dangling bonds in the semiconductor layer 110 can be cross-linked.

The channel length L of the thin film transistor of this embodiment is the total of the channel length a of the first thin film transistor and the channel length b of the second thin film transistor. The channel length a of the first thin film transistor corresponds to a distance between a side edge of a back channel of the impurity semiconductor layer 114a and an edge of a region of the microcrystalline semiconductor layer 106, which overlaps the back channel. The channel length b of the second thin film transistor corresponds to a distance between an edge of a region of the microcrystalline semiconductor layer 106, which overlaps the back channel and is in contact with the gate insulating layer 104, and a side edge of a hack channel of the impurity semiconductor layer 114b. The channel length a is increased and the channel length b is reduced, whereby on current of the thin film transistor is increased and mobility is also increased.

Note that, in the case of reducing the channel length b with respect to the channel length a, the gate insulating layer 104 is preferably formed thinly so that short channel effects do not occur in the second thin film transistor.

On the other hand, when negative voltage is applied to the gate electrode layer 102, even if carriers are induced in the microcrystalline semiconductor layer 106, current flow can be inhibited because the second thin film transistor is off. The second thin film transistor is formed using the amorphous semiconductor layer and further a leakage path and the like are less likely to be generated, and thus off current can be reduced.

As described above, the thin film transistor of an embodiment of the present invention has high on current and mobility and low off current. Furthermore, the thin film transistor of an embodiment of the present invention has excellent electric characteristics such as small subthreshold swing and subthreshold voltage which is less likely to shift.

Further, in the thin film transistor illustrated in FIGS. 1A and 1B, between the impurity semiconductor layer 114a and the impurity semiconductor layer 114b each of which serves as a source region or a drain region, a surface of the amorphous semiconductor layer 112 (a back channel portion) has unevenness, and the distance between the source region and the drain region is sufficiently long, and thus a path of leakage current is long. The back channel portion is one of main paths through which off current flows. Therefore, increase in the distance between the source region and the drain region makes it possible to reduce off current.

Furthermore, besides the insulating layer, the amorphous semiconductor layer 112 is provided between the gate electrode layer 102 and the impurity semiconductor layers 114a and 114b, and accordingly a long distance between the gate electrode layer 102 and the impurity semiconductor layers 114a and 114b can be obtained. Thus, parasitic capacitance generated between the gate electrode layer 102 and the impurity semiconductor layers 114a and 114b can be reduced.

A method for manufacturing the thin film transistor illustrated in FIG. 1A will be described below.

Note that the thin film transistor illustrated in FIG. 1A can be used as a pixel transistor for liquid crystal display devices or the like. Therefore, a method for manufacturing a pixel transistor will be described in the description below.

N-type thin film transistors generally have higher field effect mobility than p-type thin film transistors, and thus they are more suitable for being used for driver circuits. In addition, it is preferable that thin film transistors be manufactured to have the same polarity over the same substrate because it leads to reduction in the number of steps. Therefore, in this embodiment, a method for manufacturing n-type thin film transistors will be described. Note that p-type thin film transistors can be manufactured in a similar manner to the n-type thin film transistors.

First, a manufacturing process of the thin film transistor illustrated in FIG. 1A will be described with reference to FIGS. 3A to 3E, FIGS. 4A to 4D, FIG. 5, FIGS. 6A-1 to 6B-2, and FIG. 7. Note that cross-sectional views taken along the line A-B and the line C-D in FIGS. 3A to 3E and FIGS. 4A to 4D correspond to cross-sectional views taken along the line A-B and the line C-D in FIG. 5.

Figure 3A:
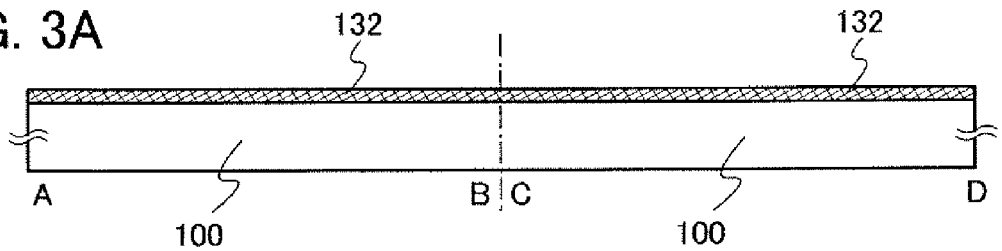
FIGS. 3A to 3E are views illustrating an example of a method for manufacturing a thin film transistor.

First, a conductive layer 132 is formed over the substrate 100 (see FIG. 3A). The conductive layer 132 becomes the gate electrode layer 102 in a later step. Therefore, the conductive layer 132 is formed using a material and a method which are used for forming the gate electrode layer 102.

Next, a resist is applied over the conductive layer 132 to form a resist mask through a photolithography step using a first photomask. The conductive layer 132 is etched into a desired shape with use of the resist mask, whereby the gate electrode layer 102 is formed. After that, the resist mask is removed.

Next, the gate insulating layer 104 is formed over the substrate 100 so as to cover the gate electrode layer 102. The gate insulating layer 104 can be formed using the above-described material and method.

Figure 3B:
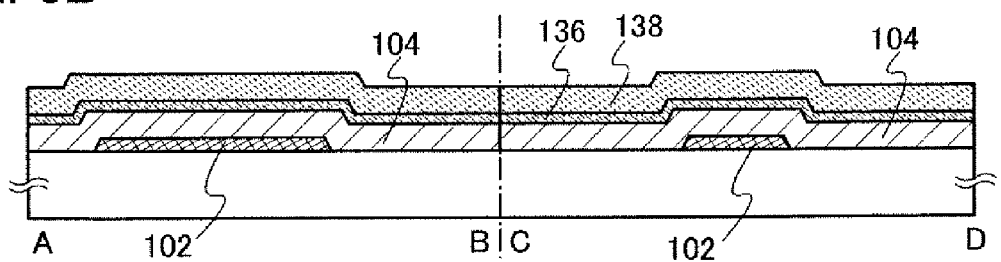

Next a microcrystalline semiconductor layer 136 is formed over the gate insulating layer 104 (see FIG. 3B).

The microcrystalline semiconductor layer 136 can be formed by glow discharge plasma, using hydrogen and a deposition gas containing silicon which are mixed in a processing chamber of a plasma CVD apparatus. The microcrystalline semiconductor layer 136 can be formed using the deposition gas containing silicon and the hydrogen which is diluted so that the flow rate of the hydrogen is 10 times to 2000 times, preferably 50 times to 200 times, as high as that of the deposition gas containing silicon. The treatment is performed while the substrate is being heated to 100° C. to 300° C., preferably 120° C. to 300° C. When a gas containing phosphorus, arsenic antimony, or the like is mixed with the above-described source gas, an impurity element which serves as a donor can be added to the microcrystalline semiconductor layer 136. Here, the microcrystalline semiconductor layer 136 is formed by glow discharge plasma, using a mixed gas of silane, hydrogen, and a rare gas (or only either hydrogen or a rare gas) and phosphine which are mixed.

Here, glow discharge plasma can be generated by application of high-frequency power with a frequency of 1 MHz to 30 MHz (typically 13.56 MHz or 27.12 MHz), or high-frequency power with a frequency in the VHF band of 30 MHz to approximately 300 MHz (typically 60 MHz).

As typical examples of the deposition gas containing silicon, there are $SiH_4$, $Si_2H_6$, and the like.

Note that the impurity element which serves as a donor may be included in the gate insulating layer 104 without being directly added to the microcrystalline semiconductor layer 136. Phosphine may be contained in a source gas of the gate insulating layer 104 so that the impurity element which serves as a donor is included in the gate insulating layer 104. For example, a silicon nitride layer containing phosphorus can be formed by a plasma CVD method using a mixed gas of silane, ammonia, and phosphine. Further, a silicon oxynitride layer containing phosphorus can be formed by a plasma CVD method using a mixed gas of silane, dinitrogen monoxide, ammonia, and phosphine.

Alternatively, before forming the microcrystalline semiconductor layer 136, a gas containing the impurity element which serves as a donor may be introduced into the processing chamber to be adsorbed onto a surface of the gate insulating layer 104 and an inner wall of the processing chamber. After that, the microcrystalline semiconductor layer 136 is formed. Through those steps, the semiconductor layer can be formed while the impurity element which serves as a donor is being taken therein.

Alternatively, phosphine may be contained in a source gas of the gate insulating layer 104, and the gate insulating layer 104 may further be exposed to phosphine.

Note that the surface of the gate insulating layer 104 is preferably subjected to plasma treatment after the formation of the gate insulating layer 104. Here, the plasma treatment can be typically performed in such a manner that the surface of the gate insulating layer 104 is exposed to any one or more of hydrogen plasma, ammonia plasma, water plasma, helium plasma, argon plasma, neon plasma, and the like. As a result, the density of defects generated on the surface of the gate insulating layer 104 can be reduced. That is because dangling bonds on the surface of the gate insulating layer 104 can be terminated.

Next, a buffer layer 138 which becomes the buffer layer 108 in a later step is formed over the microcrystalline semiconductor layer 136. The buffer layer 138 may be formed by a plasma CVD method using a deposition gas containing silicon. Alternatively, the buffer layer 138 can be formed using one or plural kinds of rare gas elements selected from helium, argon, krypton, and neon and a deposition gas containing silicon which is diluted with one or plural kinds of rare gas elements selected from helium, argon, krypton, and neon. The buffer layer 138 can be formed using the deposition gas containing silicon and hydrogen which is diluted so that the flow rate of hydrogen is 1 to 2000 times, preferably 1 to 10 times, more preferably 1 to 5 times, as high as that of the deposition gas containing silicon. Further, the buffer layer 138 including hydrogen can be formed using a silane gas and hydrogen which is introduced so that the flow rate of hydrogen is 1 to 10 times, preferably 1 to 5 times, as high as that of the silane gas. Halogen such as fluorine or chlorine may be added to the gas used for forming the buffer layer 138. Note that it is preferable that the flow rate of the silane gas in the gas used for forming the buffer layer 138 at the time of forming the buffer layer 138 is higher than that at least at the time of forming the microcrystalline semiconductor layer 136.

Alternatively, the buffer layer 138 can be formed in such a manner that a silicon target is sputtered in a hydrogen atmosphere or a rare gas atmosphere.

Further, the buffer layer 138 is preferably formed by a plasma CVD method at a temperature of 300° C. to 400° C. Through the steps, hydrogen is included in the microcrystalline semiconductor layer 136, and thus an effect equivalent to a case where the microcrystalline semiconductor layer 136 is hydrogenated can be obtained. That is, the buffer layer 138 is formed over the microcrystalline semiconductor layer 136 under the above-described conditions, so that hydrogen is diffused in the microcrystalline semiconductor layer 136 and dangling bonds can be terminated.

Further, the provision of the buffer layer 138 makes it possible to prevent natural oxidation of surfaces of crystal grains included in the microcrystalline semiconductor layer 136. Hydrogen, nitrogen, or halogen may be included in the buffer layer 138. Due to local stress, cracks are likely to be generated especially in a region where the buffer layer 138 is in contact with the crystal grains of the microcrystalline semiconductor layer 136. When the cracks are exposed to oxygen, the crystal grains are oxidized, and accordingly a thin silicon oxide layer is formed. However, the provision of the buffer layer 138 can prevent oxidation of the crystal grains included in the microcrystalline semiconductor layer 136. In addition, the thicker the buffer layer 138 is, the higher withstand voltage of the thin film transistor becomes. Therefore, breakdown or deterioration of the thin film transistor due to high voltage can be prevented.

Next, a resist is applied over the buffer layer 138, and then a resist mask is formed by photolithography. The buffer layer 138 is etched into a desired shape with use of the resist mask, whereby the buffer layer 108 is formed. After that, the resist mask is removed.

Figure 3C:
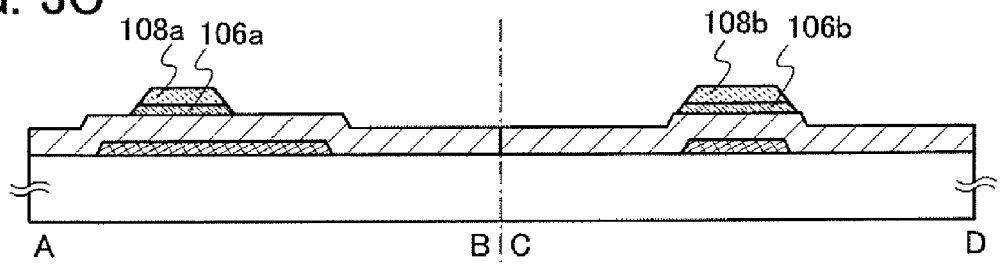
Figure 3D:
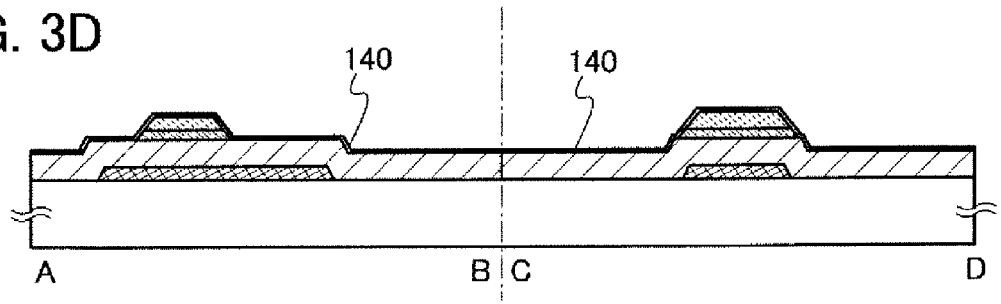

After the resist mask is removed, the microcrystalline semiconductor layer 136 is etched using the buffer layer 108 as a mask, whereby the microcrystalline semiconductor layer 106 is formed (see FIG. 3C). Through this step, part of the gate insulating layer 104 in a region which does not overlap the buffer layer 108 can also be etched. Here, in the case where the gate insulating layer 104 in which a silicon oxynitride layer is stacked over a silicon nitride layer is provided, the silicon oxynitride layer in the region which does not overlap the buffer layer 108 is preferably removed. Note that the microcrystalline semiconductor layer 136 may be etched using the resist mask used for forming the buffer layer 108 without using the buffer layer 108 as a mask.

Here, surfaces of the gate insulating layer 104 and the buffer layer 108 are preferably cleaned with fluoric acid before forming a semiconductor layer 140.

Next, the semiconductor layer 140 is formed. All formation conditions of the semiconductor layer 140 may be similar to those of the microcrystalline semiconductor layer 106 except for a condition that an impurity element which suppresses crystallization is included in the semiconductor layer 140.

Here, as an impurity element which suppresses generation of crystal nuclei, an impurity element which does not generate carrier traps in silicon (e.g., nitrogen) is selected. On the other hand, a concentration of an impurity element which reduces the coordination number of silicon and generates dangling bonds (e.g., oxygen) is reduced. Therefore, the concentration of oxygen is preferably reduced without reducing the concentration of nitrogen. Specifically, the concentration of oxygen which is measured by secondary ion mass spectrometry is preferably less than or equal to $5 \times 10^{18}$ cm$^{-3}$.

Further, the semiconductor layer 140 is formed so as to cover the gate insulating layer 104 on which nitrogen exists and the microcrystalline semiconductor layer 106 and the buffer layer 108. Crystal nuclei are generated when the concentration of nitrogen measured by secondary ion mass spectrometry is greater than or equal to $1 \times 20^{20}$ cm$^{-3}$ and less than or equal to $1 \times 20^{21}$ cm$^{-3}$, especially greater than or equal to $2 \times 10^{20}$ cm$^{-3}$ and less than or equal to $7 \times 10^{20}$ cm$^{-3}$. That is, in the crystal nuclei generation positions from which the crystal grains start to grow, the concentration of nitrogen measured by secondary ion mass spectrometry is greater than or equal to $1 \times 10^{20}$ cm$^{-3}$ and less than or equal to $1 \times 10^{21}$ cm$^{-3}$, preferably greater than or equal to $2 \times 10^{20}$ cm$^{-3}$ and less than or equal to $7 \times 10^{20}$ cm$^{-3}$. Note that with the concentration of nitrogen set within the above-described range, generation of crystal nuclei can be suppressed and can be kept to only a state in which the crystal nuclei exist in a dispersed manner; accordingly, a plurality of crystalline regions can be prevented from being formed in contact with each other and on current can be improved.

Note that crystalline regions each having an inverted-conical or inverted-pyramidal shape may be formed in such a manner that crystal nuclei are generated with the concentration of nitrogen set within the above-described range and a semiconductor material is deposited while the concentration of nitrogen is being reduced in the direction in which the semiconductor layer 140 is gradually formed, whereby the crystalline regions start to grow substantially radially from the crystal nuclei. When such crystalline regions are formed, crystalline regions each of which is similar to a single crystal including a twin crystal can be formed. Also in that case, the crystalline regions each having an inverted-conical or inverted-pyramidal shape are made to exist in a dispersed manner.

Further, the concentration of nitrogen gradually decreases as a distance from the interface with the gate insulating layer 104 increases. The concentration of nitrogen preferably decreases by one digit in the range of a distance of greater than or equal to 25 nm and less than or equal to 40 nm, more preferably in the range of a distance of greater than or equal to 30 nm and less than or equal to 35 nm.

Note that it is not preferable that the impurity element which suppresses generation of crystal nuclei exist at a high concentration (the concentration of the impurity element measured by secondary ion mass spectrometry of approximately greater than or equal to $1 \times 10^{20}$ cm$^{-3}$) in the entire semiconductor layer 140. Thus, such an impurity element is preferably added only to surfaces of the buffer layer 108 and the gate insulating layer 104, over which the semiconductor layer 140 is to be formed or introduced only at the early stage of the formation of the semiconductor layer 140.

Next, a method for forming the semiconductor layer 140 will be described. The semiconductor layer 140 may be formed to a thickness of greater than or equal to 2 nm and less than or equal to 60 nm, preferably greater than or equal to 10 nm and less than or equal to 30 nm.

Means described below are given as means of keeping the concentration of oxygen low and making the concentration of nitrogen higher than that of oxygen at the time of forming the above-described semiconductor layer 140.

One of the means of keeping the concentration of oxygen low and making the concentration of nitrogen higher than that of oxygen at the time of forming the above-described semiconductor layer 140 is a means in which nitrogen is included at a high concentration on a surface over which the semiconductor layer 140 is to be formed. Therefore, the gate insulating layer 104 is preferably formed using silicon nitride.

Another means of keeping the concentration of oxygen low and making the concentration of nitrogen higher than that of oxygen at the time of forming the above-described semiconductor layer 140 is a means in which a large amount of nitrogen is made to exist on a surface over which the semiconductor layer 140 is to be formed before the formation of the semiconductor layer 140. In order that a large amount of nitrogen is made to exist on the surface over which the semiconductor layer 140 is to be formed, the surface of the gate insulating layer 104 is preferably subjected to treatment with plasma generated by a gas containing nitrogen, after the formation of the gate insulating layer 104 and before the formation of the semiconductor layer 140. Here, ammonia is given as an example of the gas containing nitrogen.

Another means of keeping the concentration of oxygen low and making the concentration of nitrogen higher than that of oxygen at the time of forming the above-described semiconductor layer 140 is a means in which an inner wall of a processing chamber (chamber) used for forming the semiconductor layer 140 is covered with a film including nitrogen at a high concentration. A silicon nitride film is given as an example of the film containing nitrogen at a high concentration. Note that the film including nitrogen at a high concentration which covers the inner wall of the processing chamber (chamber) is preferably formed at the same time as the formation of the gate insulating layer 104 because the process can be simplified. Further, in that case, a processing chamber (chamber) used for forming the gate insulating layer 104 and a processing chamber (chamber) used for forming the microcrystalline semiconductor layer 106 are the same, and thus the size of an apparatus is reduced.

Another means of keeping the concentration of oxygen low and making the concentration of nitrogen higher than that of oxygen at the time of forming the above-described semiconductor layer 140 is a means in which the concentration of oxygen contained in a gas which is used for forming the semiconductor layer 140 is kept low and the concentration of nitrogen is made high. In that case, nitrogen may be introduced only to a gas which is used at the early stage of the formation of the semiconductor layer 140, or the amount of nitrogen to be introduced may be reduced.

Note that one of the above-described means may be used here, or the above-described means may be used in combination. Here, the gate insulating layer 104 has a structure in which the silicon oxynitride layer is stacked over the silicon nitride layer and is exposed to ammonia, whereby nitrogen is supplied to the surface over which the semiconductor layer 140 is to be formed.

Figure 7:
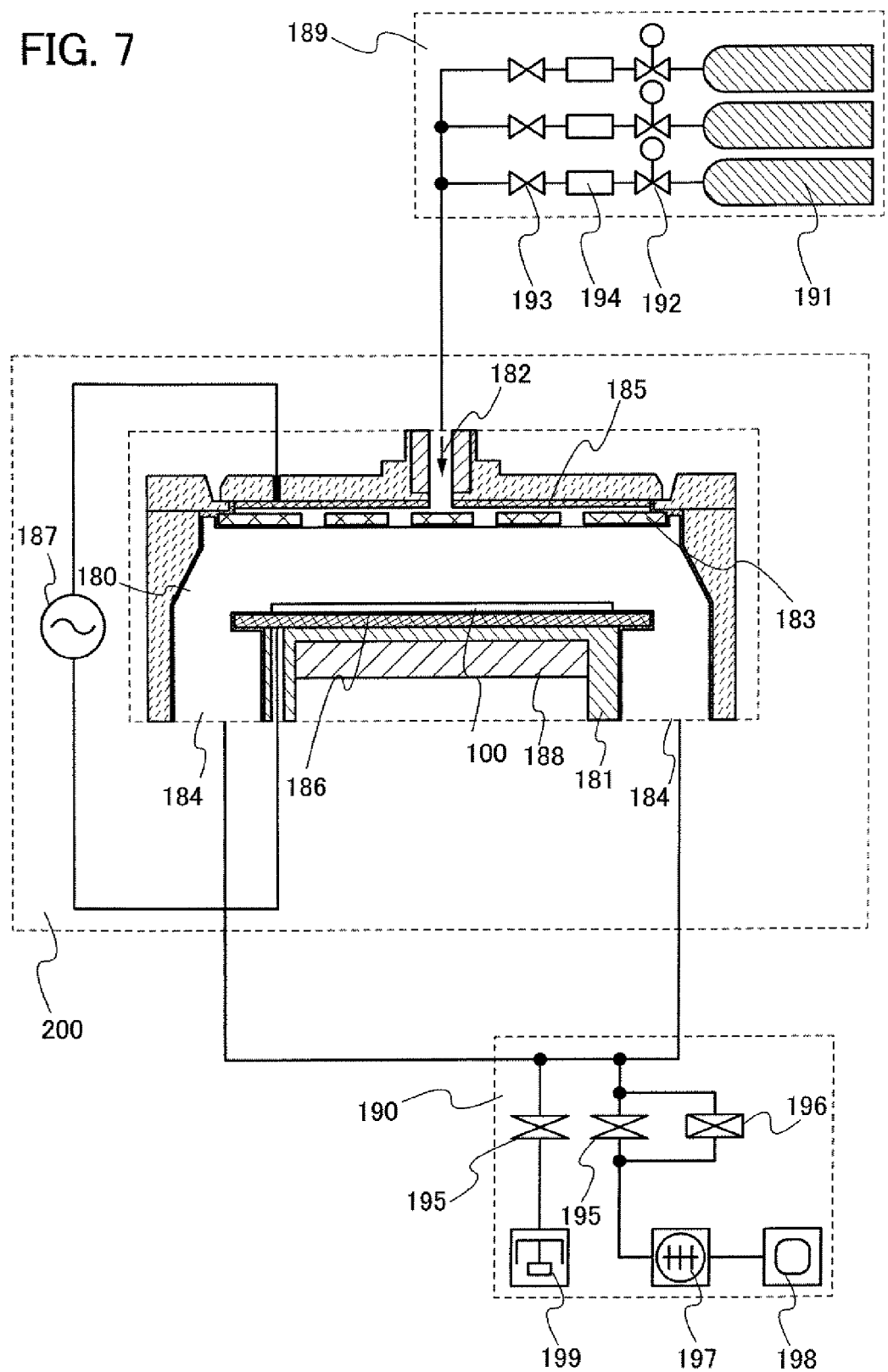
FIG. 7 is a view illustrating a method for manufacturing a thin film transistor.

Here, examples of methods for forming the gate insulating layer 104, the semiconductor layer 140, the buffer layer 138, an amorphous semiconductor layer 142, and an impurity semiconductor layer 144 will be described in detail. Note that the formation methods described below are merely examples, and the present invention is not limited thereto. Those layers are formed by a CVD method or the like. Further, the gate insulating layer 104 has a structure in which a silicon oxynitride layer is stacked over a silicon nitride layer. Such a structure can prevent an element included in the substrate which affects the electric characteristics (an element such as sodium in the case where the substrate is made of glass) from entering the semiconductor layer 140 and the like because of the silicon nitride layer. FIG. 7 schematically illustrates a CVD apparatus which is used for forming those layers.

A plasma CVD apparatus 200, the cross-sectional view of which is illustrated in FIG. 7 is connected to a gas introduction unit 189 and an exhaust unit 190.

The plasma CVD apparatus 200 illustrated in FIG. 7 includes a processing chamber 180, a stage 181, a gas introduction portion 182, a shower plate 183, an exhaust port 184, an upper electrode 185, a lower electrode 186, an alternate-current power source 187, and the temperature controller 188.

The processing chamber 180 is formed using a stiff material, and the inside of the processing chamber 180 can be evacuated to vacuum. The upper electrode 185 and the lower electrode 186 are provided in the processing chamber 180. Note that, although FIG. 7 illustrates the capacitively coupled type (parallel plate type) structure, another structure such as an inductively coupled type structure may be employed as long as plasma can be generated inside the processing chamber 180 by application of two or more kinds of high-frequency electric power.

When treatment is performed with the plasma CVD apparatus illustrated in FIG. 7, a given gas is introduced from the gas introduction portion 182. The introduced gas is introduced into the processing chamber 180 through the shower plate 183. High-frequency power is applied with the alternate-current power source 187 connected to the upper electrode 185 and the lower electrode 186 to excite the gas in the processing chamber 180, thereby generating plasma. Further, the gas in the processing chamber 180 is exhausted through the exhaust port 184 which is connected to a vacuum pump. Further, plasma treatment can be performed while an object to be processed is being heated with a temperature controller 188.

The gas introduction unit 189 includes a cylinder 191 which is filled with a reaction gas, a pressure adjusting valve 192, a stop valve 193, a mass flow controller 194, and the like. In the processing chamber 180, the shower plate which has a plurality of pores and processed into a plate form is provided between the upper electrode 185 and the substrate 100. A reaction gas introduced to the upper electrode 185 is introduced into the processing chamber 180 through the pores through the inside hollow structure.

The exhaust unit 190 connected to the processing chamber 180 includes a function of vacuum evacuation and a function of controlling to keep the processing chamber 180 at a predetermined pressure when the reaction gas is supplied. The exhaust unit 190 includes butterfly valves 195, a conductance valve 196, a turbomolecular pump 197, a dry pump 198, and the like. In the case of arranging the butterfly valve 195 and the conductance valve 196 in parallel, the butterfly valve is closed and the conductance valve 196 is made to operate, whereby the exhaust velocity of the reaction gas is controlled, and thus the pressure inside the processing chamber 180 can be kept within a given range. Further, when the butterfly valve 195 with large conductance is opened, high-vacuum evacuation can be performed.

Note that in the case where the processing chamber 180 is evacuated to pressure lower than $10^{-5}$ Pa, it is preferable to additionally use a cryo pump 199. Alternatively, in the case where the processing chamber 180 is evacuated to ultra-high vacuum as ultimate vacuum, the inner wall of the processing chamber 180 may be subjected to mirror-like finishing, and a heater for baking may be provided and used so that the amount of gas released from the inner wall is reduced.

Note that as illustrated in FIG. 7, pre-coating treatment is performed so that a film is formed (adheres) so as to cover the entire processing chamber 180, whereby an impurity element attached to the inner wall of the processing chamber (chamber) or an impurity element included in the inner wall of the processing chamber (chamber) can be prevented from entering an element. In this embodiment, for the pre-coating treatment, a film containing silicon as its main component, for example, an amorphous silicon film may be formed. Note that it is preferable that the film do not contain oxygen.

Here, description will be made on the formation of from the gate insulating layer 104 to the impurity semiconductor layer 154. Note that the gate insulating layer 104 is formed to have a structure in which a silicon oxynitride layer is stacked over a silicon nitride layer.

First, the substrate over which the gate electrode layer 102 is formed is heated in the processing chamber 180 of the CVD apparatus, and in order to form the silicon nitride layer, material gases used for forming the silicon nitride layer are introduced into the processing chamber 180. Here, as an example, the silicon nitride layer with a thickness of about 110 nm is formed by plasma discharge at 370 W under such conditions: the material gases are introduced at a flow rate of $SiH_4$ of 40 sccm, a flow rate of $H_2$ of 500 sccm, a flow rate of $N_2$ of 550 sccm, and a flow rate of $NH_3$ of 140 seem and are stabilized, the pressure inside the processing chamber 180 is 100 Pa, and the temperature is 280° C. After that only the introduction of $SiH_4$ is stopped, and after several seconds, the plasma discharge is stopped. That is because if the plasma discharge is stopped with $SiH_4$ existing in the processing chamber, particulates or powder substances containing silicon as its main component are formed, which results in reduction in yield. Note that either the $N_2$ gas or the $NH_3$ gas may be used, and in the case of mixing the gases to be used, the flow rates of the gases are preferably adjusted as appropriate. Further, the introduction and flow rate of the $H_2$ gas are adjusted as appropriate, and the 112 gas is not necessarily introduced.

Next, the material gases used for forming the silicon nitride layer are exhausted, and then material gases used for forming the silicon oxynitride layer are introduced into the processing chamber 180. Here, as an example, the silicon oxynitride layer with a thickness of about 110 nm is formed by plasma discharge at 50 W under such conditions that the material gases are introduced at a flow rate of $SiH_4$ of 30 sccm and a flow rate of $N_2O$ of 1200 sccm and are stabilized, the pressure inside the processing chamber 180 is 40 Pa, and the temperature is 280° C. After that, similarly to the formation of the silicon nitride layer, only the introduction of $SiH_4$ is stopped, and after several seconds, the plasma discharge is stopped.

As an example, the microcrystalline semiconductor layer is formed by plasma discharge at 300 W under such conditions that material gases are introduced at a flow rate of $SiH_4$ of 10 sccm, a flow rate of 0.5 vol % phosphine (the flow rate of $PH_3$ diluted with $H_2$ to 0.5%) of 30 sccm, and a flow rate of $H_2$ of 1500 sccm and are stabilized, the pressure inside the processing chamber is 280 Pa, and the temperature is 280° C.

Next, the material gases used for forming the microcrystalline semiconductor layer are exhausted, and then material gases used for forming the amorphous semiconductor layer are introduced into the processing chamber 180. Here, as an example, the amorphous semiconductor layer with a thickness of about 75 nm is formed by plasma discharge at 60 W under such conditions that the material gases are introduced at a flow rate of $SiH_4$ of 280 sccm and a flow rate of $H_2$ of 300 sccm and are stabilized, the pressure inside the processing chamber is 170 Pa, and the temperature is 280° C. After that, in a similar manner to the formation of the silicon nitride layer and the like, only the introduction of $SiH_4$ is stopped, and after several seconds, the plasma discharge is stopped.

After the buffer layer 138 is formed using an amorphous semiconductor, the substrate 100 is carried out of the processing chamber 180, and a resist mask is formed by photolithography. The microcrystalline semiconductor layer 136 and the buffer layer 138 are etched using the resist mask, whereby the microcrystalline semiconductor layer 106 and the buffer layer 108 are formed. Through the etching step, in the gate insulating layer 104, the silicon oxynitride layer only in a region which overlaps the microcrystalline semiconductor layer 106 remains, while the silicon oxynitride layer in a region which does not overlap the microcrystalline semiconductor layer 106 is removed. After that, the resist mask is removed.

After the substrate 100 is carried out of the processing chamber 180, for example, an $NF_3$ gas is introduced into the processing chamber 180 to clean the inside of the processing chamber 180. After that, the inner wall of the processing chamber 180 is covered with an amorphous silicon film. Although the amorphous silicon film is formed in a similar manner to the formation of the buffer layer 138 and the like, which is formed later, hydrogen may or may not be introduced into the processing chamber 180. Through the treatment, the inner wall of the processing chamber 180 is covered with the amorphous silicon film. Alternatively, pre-coating treatment may be performed using a silicon nitride film. The treatment in that case is similar to the treatment for forming the gate insulating layer 104. Then, the substrate 100 is carried into the processing chamber 180, and an ammonia gas is introduced into the processing chamber 180.

Next, nitrogen is supplied to the surface over which the semiconductor layer 140 is to be formed. Here, the gate insulating layer 104, the microcrystalline semiconductor layer 106, and the buffer layer 108 are exposed to the ammonia gas, whereby nitrogen is supplied to those layers. Further, hydrogen may be contained in the ammonia gas. Here, as an example, it is preferable that the pressure inside the processing chamber 180 be approximately 20 Pa to 30 Pa, the temperature be 280° C., and the processing time be 60 seconds. Note that, although the substrate 100 is only exposed to the ammonia gas in the treatment of the step, plasma treatment may also be performed. After that, those gases are exhausted, and material gases used for forming the semiconductor layer 140 are introduced into the processing chamber 180.

Note that before nitrogen is supplied to the surface over which the semiconductor layer 140 is to be formed, the surface may be cleaned with fluoric acid.

Next, the semiconductor layer 140 is formed over the entire surface over which the semiconductor layer 140 is to be formed. The semiconductor layer 140 is patterned in a later step to become the semiconductor layer 110. First, material gases used for forming the semiconductor layer 140 are introduced into the processing chamber 180. Here, as an example, the semiconductor layer 140 with a thickness of about 50 nm can be formed by plasma discharge at 300 W under such conditions that the material gases are introduced at a flow rate of $SiH_4$ of 10 sccm and a flow rate of $H_2$ of 1500 sccm and are stabilized, the pressure inside the processing chamber is 280 Pa, and the temperature is 280° C. After that, in a similar manner to the above-described formation of the silicon nitride layer and the like, only the introduction of $SiH_4$ is stopped, and after several seconds, the plasma discharge is stopped. Then, those gases are exhausted, and gases used for forming the amorphous semiconductor layer 142 are introduced.

In the above-described example, as for the material gases used for forming the semiconductor layer 140, the flow rate of $H_2$ is 150 times as high as that of $SiH_4$. Therefore, silicon is gradually deposited.

In this embodiment, nitrogen is supplied to the surface over which the semiconductor layer 140 is to be formed. As described above, nitrogen suppresses generation of crystal nuclei of silicon. Thus, crystal nuclei of silicon are not generated at least at the early stage of the formation of the semiconductor layer 140. As described above, nitrogen is supplied to the surfaces of the gate insulating layer 104 and the like and the semiconductor layer 140 is formed over the surfaces, so that the semiconductor layer 140 including nitrogen is formed. The formation of the semiconductor layer 140 proceeds while the concentration of nitrogen is being reduced, and when the concentration of nitrogen reaches a value lower than or equal to a given value, crystal nuclei are generated depending on the relation between the thickness of the formed semiconductor layer 140 and the concentration of nitrogen. In that case, after the generation of the crystal nuclei, the crystal nuclei grow to generate crystal grains. However, even in the case where crystal nuclei are generated, crystal grains just exist in a dispersed manner.

Next, the amorphous semiconductor layer 142 is formed on an entire surface of the semiconductor layer 140. The amorphous semiconductor layer 142 is patterned in a later step to become the amorphous semiconductor layer 112. Here, as an example, the amorphous semiconductor layer 142 with a thickness of about 150 nm can be formed by plasma discharge at 60 W under such conditions that material gases are introduced at a flow rate of $SiH_4$ of 280 sccm and a flow rate of $H_2$ of 300 sccm and are stabilized, the pressure inside the processing chamber is 170 Pa, and the temperature is 280° C. After that, in a similar manner to the above-described formation of the silicon nitride layer and the like, only the introduction of $SiH_4$ is stopped, and after several seconds, the plasma discharge is stopped. Then, those gases are exhausted, and gases used for forming the impurity semiconductor layer 144 are introduced.

Next, the impurity semiconductor layer 144 is formed on an entire surface of the amorphous semiconductor layer 142. The impurity semiconductor layer 144 is patterned in a later step to become the source and drain regions. First, material gases used for forming the impurity semiconductor layer 144 are introduced into the processing chamber 180. Here, as an example, the impurity semiconductor layer 144 with a thickness of about 50 nm can be formed by plasma discharge at 60 W under such conditions that the material gases are introduced at a flow rate of $SiH_4$ of 100 sccm and a flow rate of a mixed gas, in which $PH_3$ is diluted with $H_2$ to 0.5 vol %, of 170 sccm and are stabilized, the pressure inside the processing chamber 180 is 280 Pa, and the temperature is 280° C. After that, in a similar manner to the above-described formation of the silicon nitride layer and the like, only the introduction of SiH$_4$ is stopped, and after several seconds, the plasma discharge is stopped. Then, those gases are exhausted.

In the above-described manner, the formation up to the impurity semiconductor layer 144 can be performed.

Note that when the amorphous semiconductor layer 142 is formed, after the inner wall of the processing chamber of the plasma CVD apparatus is pre-coated with a silicon nitride oxide layer, a silicon nitride layer, a silicon oxide layer, and a silicon oxynitride layer, hydrogen is diluted so that the flow rate thereof is 10 times to 2000 times, preferably 50 times to 200 times, as high as the flow rate of a deposition gas containing silicon to form the semiconductor layer, so that a semiconductor material is deposited while oxygen, nitrogen, and the like existing in the inner wall of the processing chamber are being taken in. Thus, a dense amorphous semiconductor layer can be formed while crystallization is being suppressed. Note that crystal grains may be included in part of the amorphous semiconductor layer 142.

Note that the impurity semiconductor layer 144 can be formed by a plasma CVD method using a mixed gas of phosphine and a deposition gas containing silicon. Note that in the case of manufacturing a p-channel thin film transistor, the impurity semiconductor layer 144 can be formed by a plasma CVD method using a mixed gas of diborane and a deposition gas containing silicon.

Note that in the formation processes of the microcrystalline semiconductor layer 136, the buffer layer 138, the amorphous semiconductor layer 142, and the impurity semiconductor layer 144, glow discharge plasma can be generated by application of high-frequency power with a frequency of 1 MHz to 30 MHz (typically 13.56 MHz or 27.12 MHz), or high-frequency power with a frequency in the VHF band of 30 MHz to approximately 300 MHz (typically 60 MHz).

Next, a conductive layer 146 is formed over the impurity semiconductor layer 144. The conductive layer 146 becomes the wiring layer 116*a*, the wiring layer 116*b*, and a wiring layer 116*c* in a later step. Therefore, the conductive layer 146 can be formed using a material and a method which are used for forming the wiring layer 116. Note that the conductive layer 146 may be formed to have a structure in which a plurality of layers are stacked.

Figure 3E:
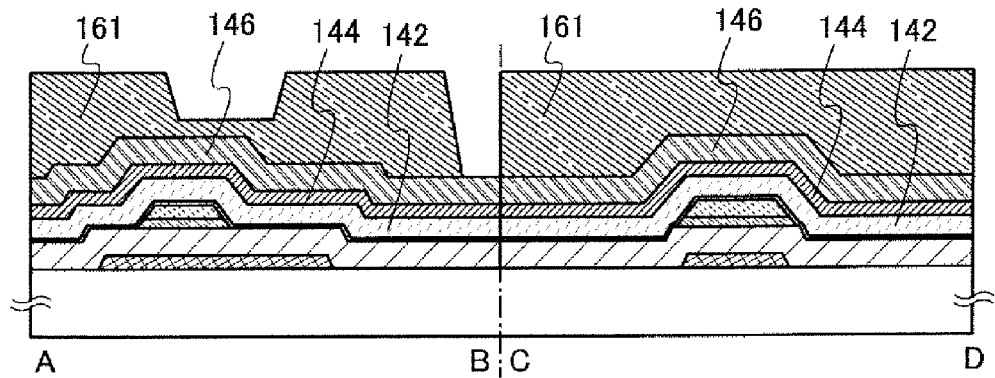

Next, a first resist mask 161 is formed over the conductive layer 146 (see FIG. 3E). The first resist mask 161 has two regions whose thicknesses are different. Such a resist mask can be formed using a multi-tone mask. It is preferable to use a multi-tone mask because the number of photomasks which are used and the number of manufacturing steps are reduced.

The first resist mask 161 can be formed using a common multi-tone mask. Here, multi-tone masks will be described with reference to FIGS. 6A-1 to 6B-2.

A multi-tone mask is a mask which is capable of light exposure with multi-level light intensity, and light exposure is typically performed with three levels of light intensity to provide an exposed region, a half-exposed region, and a non-exposed region. When a multi-tone mask is used, one-time light exposure and development process allow a resist mask with plural thicknesses (typically, two levels of thicknesses) to be formed. Therefore, by use of a multi-tone mask, the number of photomasks can be reduced.

Figures 1, 6A:
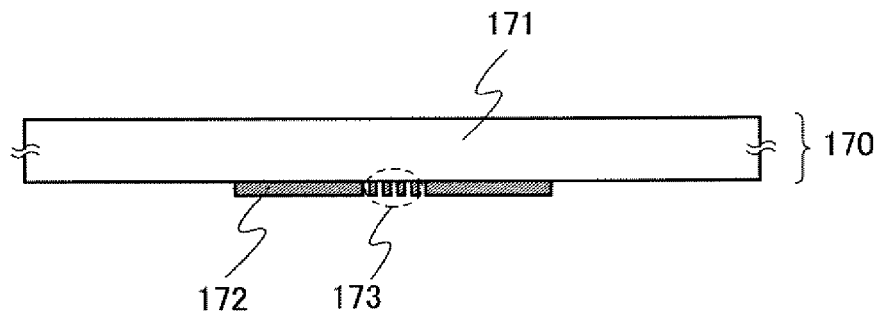
Figures 2, 6A:
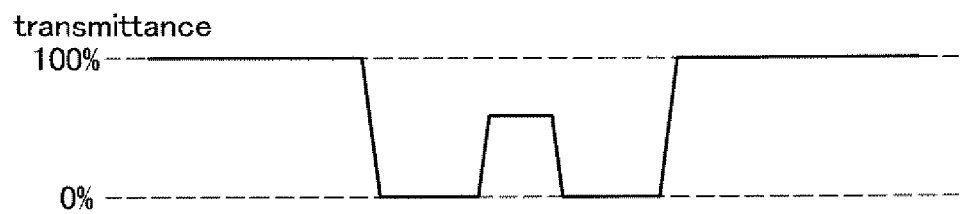
Figures 1, 6B:
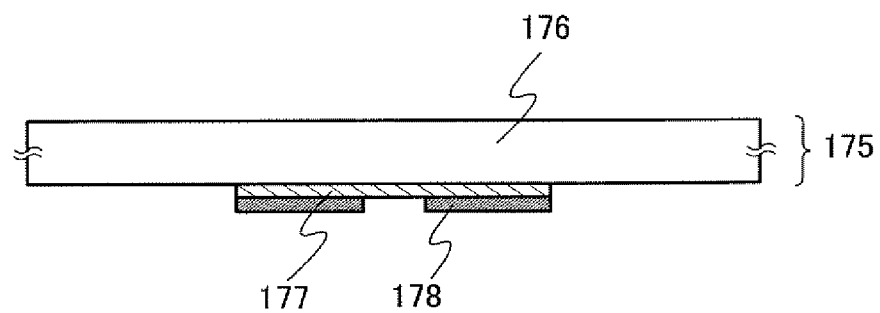
Figures 2, 6B:
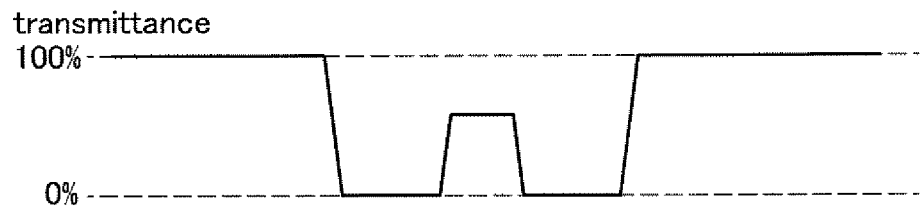

FIGS. 6A-1 and FIG. 6B-1 are cross-sectional views of typical multi-tone masks. FIG. 6A-1 illustrates a gray-tone mask 170 and FIG. 6B-1 illustrates a halftone mask 175.

The gray-tone mask 170 illustrated in FIG. 6A-1 includes a light-blocking portion 172 which is formed using a light-blocking material on a substrate 171 having a light-transmitting property, and a diffraction grating portion 173 having a pattern which is provided with respect to the light-blocking portion 172.

The transmittance of light is controlled at the diffraction grating portion 173 in such a manner that slits, dots, mesh, and the like are provided at an interval less than or equal to the resolution limit of light used for light exposure. Note that the slits, the dots, or the mesh provided at the diffraction grating portion 173 may be provided periodically or nonperiodically.

For the substrate 171 having a light-transmitting property, quartz or the like can be used. The light-blocking film forming the light-blocking portion 172 and the diffraction grating portion 173 may be formed using metal, preferably chromium, chromium oxide, or the like.

In the case where the gray-tone mask 170 is irradiated with light for light exposure, as illustrated in FIG. 6A-2, the transmittance in a region overlapping the light-blocking portion 172 is 0%, whereas the transmittance in a region where both the light-blocking portion 172 and the diffraction grating portion 173 are not provided is 100%. Further, the transmittance at the diffraction grating portion 173 is basically in the range of 10% to 70%, which can be controlled by an interval of slits, dots, or mesh of the diffraction grating, or the like.

The half-tone mask 175 illustrated in FIG. 6B-1 includes a semi-light-transmitting portion 177 formed using a semi-light-transmitting material on a substrate 176 having a light-transmitting property, and a light-blocking portion 178 formed using a light-blocking material.

The semi-light-transmitting portion 177 can be formed using MoSiN, MoSi, MoSiO, MoSiON, CrSi, or the like. The light-blocking portion 178 may be formed using metal which is similar to the metal used for forming the light-blocking portion 172 of the gray-tone mask, preferably chromium, chromium oxide, or the like.

In the case where the half-tone mask 175 is irradiated with light for light exposure, as illustrated in FIG. 6B-2, the transmittance in a region overlapping the light-blocking portion 178 is 0%, whereas the transmittance in a region where both the light-blocking portion 178 and the semi-light-transmitting portion 177 are not provided is 100%. Further, the transmittance in the semi-light-transmitting portion 177 is basically in the range of 10% to 70%, which can be controlled by the type, the thickness, or the like of the material to be formed.

By light exposure using the multi-tone mask and development, a resist mask which includes regions having different thicknesses can be formed.

The semiconductor layer 140, the amorphous semiconductor layer 142, the impurity semiconductor layer 144, and the conductive layer 146 are etched using the first resist mask 161 formed using the multi-tone mask. Accordingly, the semiconductor layer 110, an amorphous semiconductor layer 152, an impurity semiconductor layer 154, and a conductive layer 156 can be formed.

Next, the first resist mask 161 is made to recede, so that a second resist mask 162 is formed. As an example of means of making the first resist mask 161 to recede, ashing with oxygen plasma is given. When the first resist mask 161 is made to recede, the area of the resist mask and the thickness thereof are reduced. At this time, the resist mask in a region having a small thickness (a depressed portion of the first resist mask 161 in FIG. 3E, which overlaps part of the gate electrode layer 102) is removed, so that the second resist mask 162 is formed (see FIG. 4A).

Figure 4A:
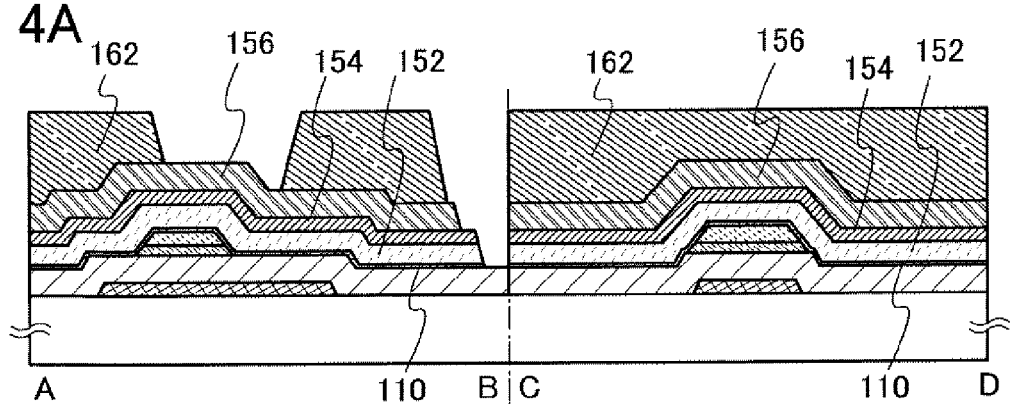
FIGS. 4A to 4D are views illustrating an example of a method for manufacturing a thin film transistor.
Figure 4B:
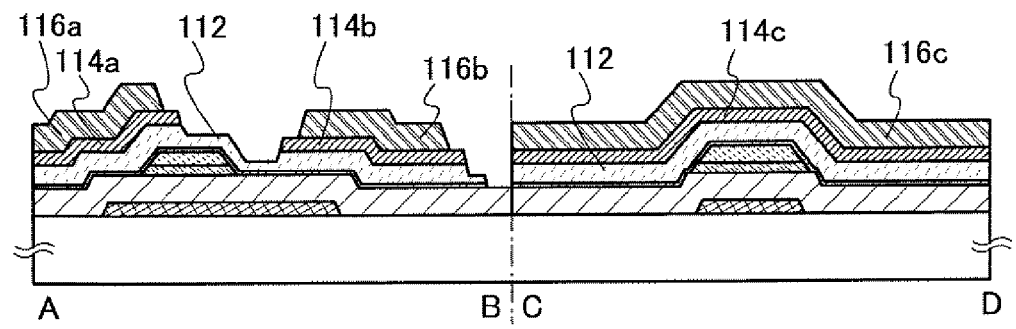
Figure 4C:
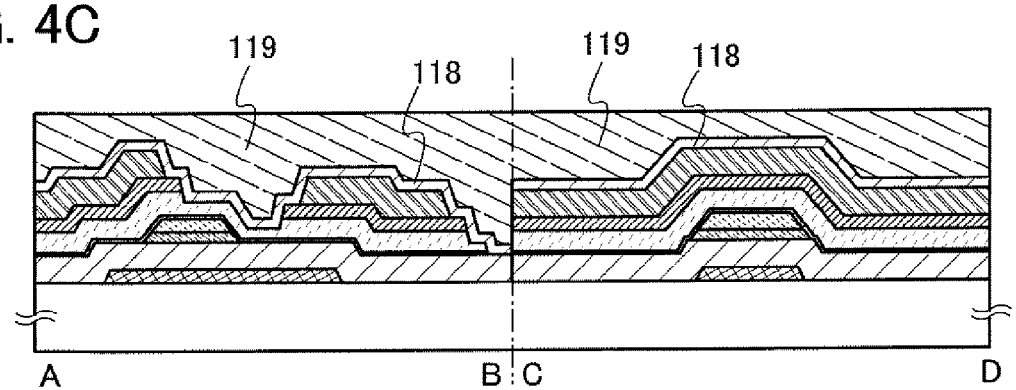
Figure 5:
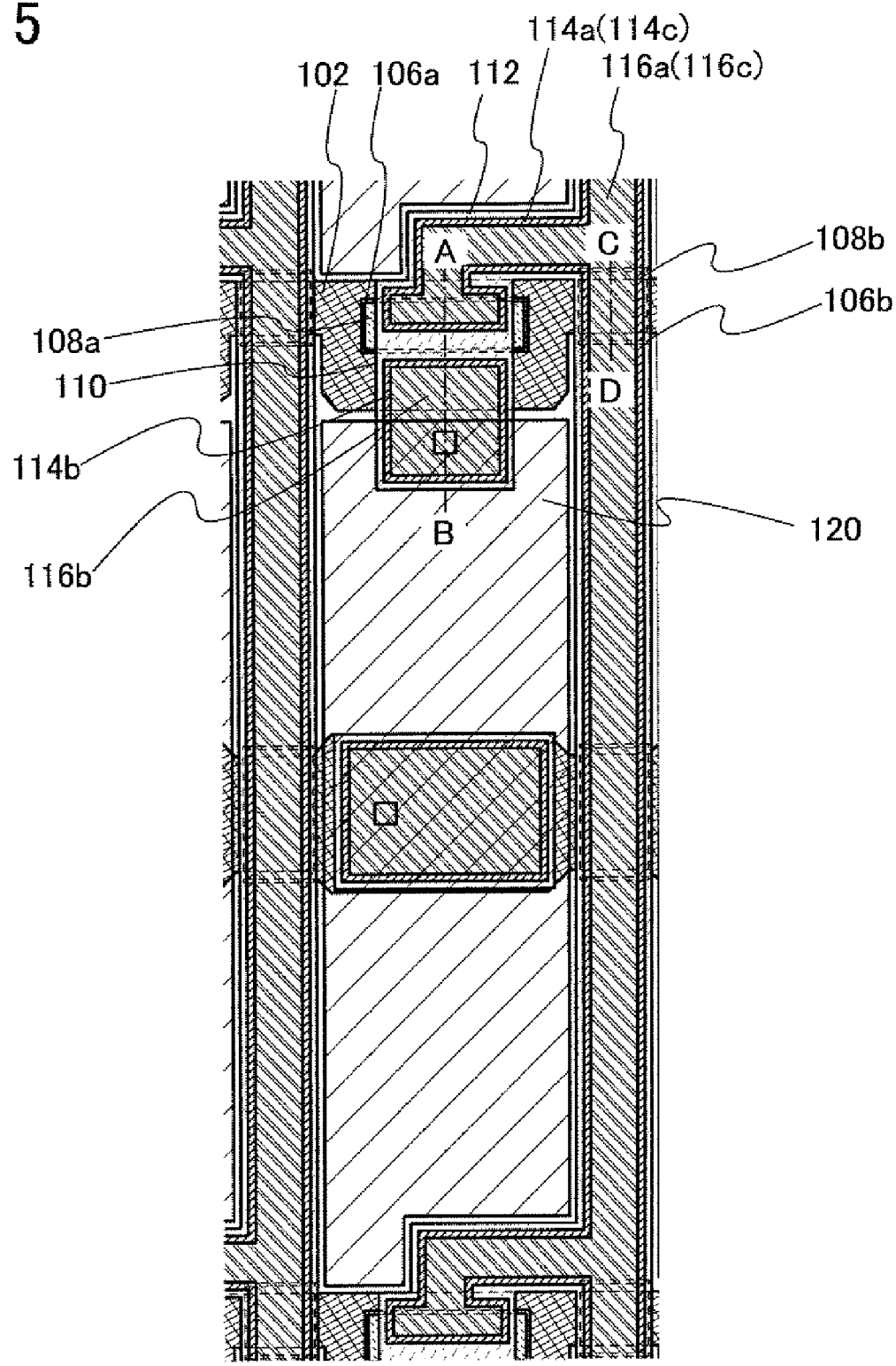
FIG. 5 is a view illustrating an example of a method for manufacturing a thin film transistor.

Next, the amorphous semiconductor layer 152, the impurity semiconductor layer 154, and the conductive layer 156 are etched using the second resist mask 162 (see FIG. 4B). First, the conductive layer 156 is etched using the second resist mask 162, whereby the wiring layer 116a and the wiring layer 116b are formed. When the conductive layer 156 is etched by wet etching using the second resist mask 162, an edge of the conductive layer 156 is selectively etched. Accordingly, the wiring layer 116a, the wiring layer 116b, and the wiring layer 116c, the area of each of which is smaller than that of the second resist mask 162, can be formed. Note that dry etching may also be used without limitation to the wet etching.

Next, the impurity semiconductor layer 154 is etched using the second resist mask 162, whereby the impurity semiconductor layer 114a, the impurity semiconductor layer 114b, and an impurity semiconductor layer 114c are formed. Note that in this etching step, part of the amorphous semiconductor layer 152 is also etched, whereby the amorphous semiconductor layer 112 is formed.

Here, an intersection portion of the gate electrode layer 102 and the wiring layer 116c (illustrated in the right part of FIG. 4B) is focused. Through the above-described steps, in addition to the gate insulating layer 104, the microcrystalline semiconductor layer 106b, the buffer layer 108b, the amorphous semiconductor layer 112, and the impurity semiconductor layer 114c are formed between the gate electrode layer 102 and the wiring layer 116c. Such a structure enables a long distance between the gate electrode layer 102 and the wiring layer 116c. Therefore, parasitic capacitance in the region where the gate electrode layer 102 and the wiring layer 116c intersect can be reduced.

Note that an edge of the wiring layer 116a and an edge of the impurity semiconductor layer 114a are not aligned; an edge of the wiring layer 116b and an edge of the impurity semiconductor layer 114b are not aligned; and the edges of the impurity semiconductor layer 114a and the impurity semiconductor layer 114b are formed outside the edges of the wiring layer 116a and the wiring layer 116b, respectively. After that, the second resist mask 162 is removed. As a means of removing the second resist mask 162, any of the two following means is preferably used.

As one of the means of removing the second resist mask 162, a means in which ashing is performed to make the second resist mask 162 recede to be removed is given. In that case, after the second resist mask 162 is removed, dry etching is preferably performed in order to remove an etching residue or the like in the back channel portion. Here, it is preferable that the dry etching be performed with no bias applied so that the amorphous semiconductor layer 112 in the back channel portion is not damaged. For example, a chlorine gas can be used as an etching gas. Through this etching step, off current of the thin film transistor can be reduced.

As the other means of removing the second resist mask 162, $H_2O$ plasma treatment is given. Here, the $H_2O$ plasma treatment can be performed typically in such a manner that plasma discharge is performed in an atmosphere containing vaporized water to generate radicals and a surface to be irradiated is irradiated with the radicals. The $H_2O$ plasma treatment is performed with the back channel portion of the amorphous semiconductor layer 112 exposed, whereby electric characteristics of the thin film transistor can be improved.

Note that also in the case where the second resist mask 162 is removed by the $H_2O$ plasma treatment, the above-described dry etching step for the purpose of removing an etching residue or the like in the back channel portion may be performed. In that case, the dry etching is performed after the $H_2O$ plasma treatment.

Note that, even in the case where the second resist mask 162 is removed by a means of removing after ashing, the $H_2O$ plasma treatment may be performed after the above-described dry etching step which is performed in order to remove an etching residue or the like in the back channel portion. Furthermore, the $H_2O$ plasma treatment may also be performed on the back channel portion without limitation to the above-described method.

Through the above-described steps, the thin film transistor illustrated in FIG. 1A can be manufactured. The thin film transistor which is manufactured in the above-described manner has low off current, high on current, and is capable of high speed operation. Further, an element substrate including this thin film transistor as a switching element of a pixel can be manufactured. Note that, since the microcrystalline semiconductor layer and the buffer layer are etched into a predetermined shape, the number of photomasks to be used is increased by one, as compared to a manufacturing process of a normal inverted staggered thin film transistor. However, the multi-tone mask is used as a photomask for etching the amorphous semiconductor layer, the impurity semiconductor layer, and the wiring layer into predetermined shapes; thus, the thin film transistor can be manufactured without increasing the number of masks as a whole, as compared to a conventional manufacturing process of a thin film transistor without a multi-tone mask. Note that without limitation thereto, a resist mask may be formed without a multi-tone mask.

Note that the thin film transistor which is an embodiment of the present invention can be applied to a pixel transistor which is provided in a pixel portion of a display device typified by a liquid crystal display device or the like. In the case where the thin film transistor is applied to a pixel transistor, a pixel electrode may be connected to the wiring layer 116a or the wiring layer 116b of the thin film transistor. Steps after the manufacture of the thin film transistor will be described below.

First, after the step of manufacturing the thin film transistor, which is illustrated in FIG. 4B, is terminated, a protective insulating layer is formed so as to cover the thin film transistor. The protective insulating layer is preferably formed of a first protective insulating layer 118 and a second protective insulating layer 119 (see FIG. 4C).

The first protective insulating layer 118 is preferably provided using an inorganic material by a CVD method or the like. The first protective insulating layer 118 may be formed, for example, using a material and a method which are similar to those used for forming the gate insulating layer 104.

The second protective insulating layer 119 is formed by a method which enables a surface to be substantially flat. That is because when the surface of the second protective insulating layer 119 is made substantially flat, step disconnection or the like of a pixel electrode layer 120 which is formed over the second protective insulating layer 119 can be prevented. Therefore, the phrase "substantially flat" here may be the level which can achieve the above-described purpose, and high flatness is not required. Thus, the second protective insulating layer 119 may be formed using, for example, photosensitive polyimide, acrylic, or an epoxy resin or the like by a spin coating method or the like.

Next, an opening is provided in the first protective insulating layer 118 and the second protective insulating layer 119. Here, the opening is formed so as to reach the wiring layer 116b (or the wiring layer 116a). For example, a photosensitive material is contained in the second protective insulating layer 119 and the second protective insulating layer 119 is exposed to light, whereby the opening can be formed.

Figure 4D:
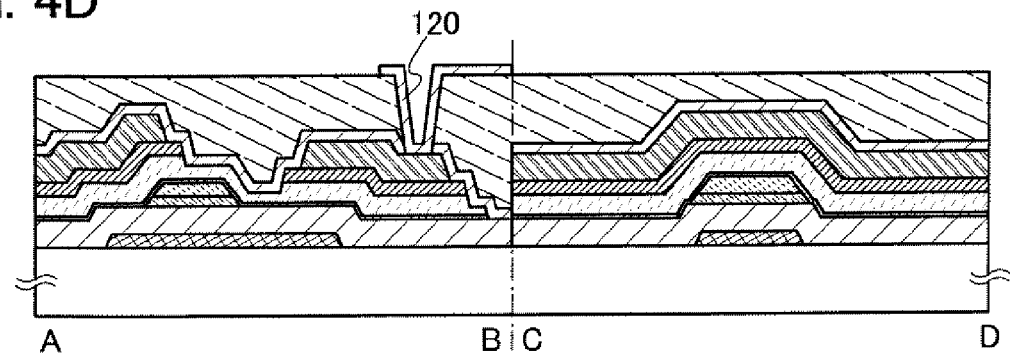

Next, the pixel electrode layer 120 is formed over the second protective insulating layer 119 (see FIG. 4D). The pixel electrode layer 120 is formed so as to be connected to the wiring layer 116b (or the wiring layer 116a) through the opening. That is, the pixel electrode layer 120 is formed so as to be connected to a source electrode and a drain electrode through the opening. The pixel electrode layer 120 is preferably formed using a conductive material having a light-transmitting property. Here, as the conductive material having a light-transmitting property, the following can be given: indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like. The pixel electrode layer 120 may be formed by a sputtering method, a CVD method, or the like. Further, the pixel electrode layer 120 may have a single-layer structure or a structure in which a plurality of layers are stacked.

In the above-described manner, the pixel transistor of a display device can be manufactured.

Figure 9A:
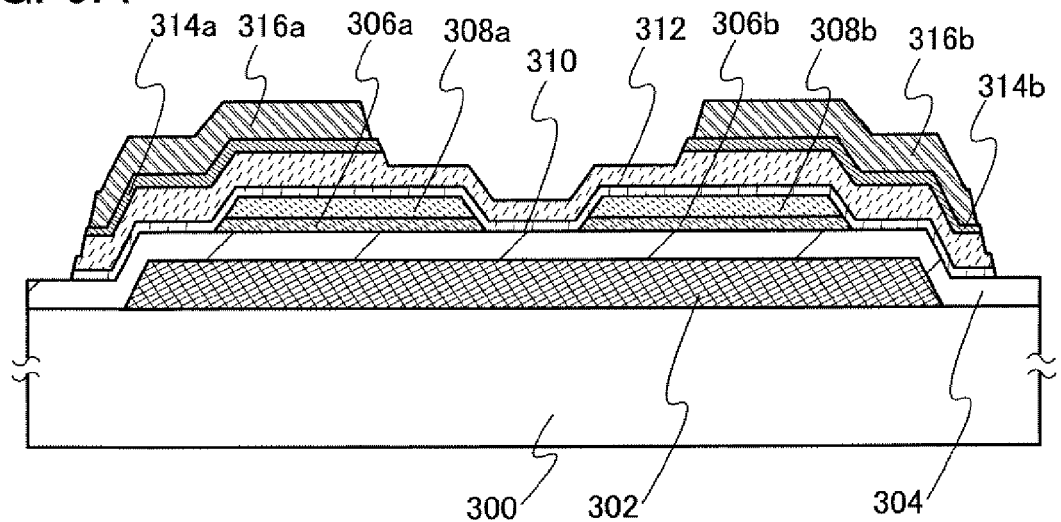
FIGS. 9A and 9B are views each illustrating an example of a structure of a thin film transistor.
Figure 9B:
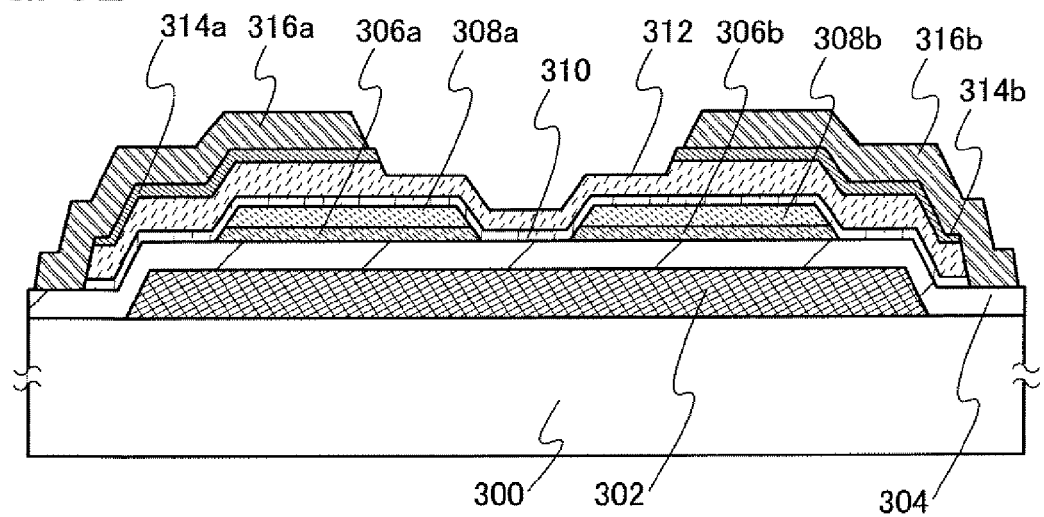

Note that modes illustrated in FIGS. 9A and 9B may be employed without limitation to the above description. A thin film transistor illustrated in FIG. 9A has a gate electrode layer 302 which is provided over a substrate 300; a gate insulating layer 304 which is provided so as to cover the gate electrode layer 302; an impurity semiconductor layer 314a and an impurity semiconductor layer 314b forming a source region and a drain region which are provided so that at least part of each of the impurity semiconductor layers 314a and 314b overlaps the gate electrode layer 302 and which are provided with a space therebetween; a microcrystalline semiconductor layer 306a and a microcrystalline semiconductor layer 306b which are provided over the gate insulating layer 304 in part of a channel length so that at least part of each of the microcrystalline semiconductor layers 306a and 306b overlaps the gate electrode layer 302 and one of the impurity semiconductor layers 314a and 314b; a buffer layer 308a and a buffer layer 308b which are provided over the gate insulating layer 304 so as to cover at least the microcrystalline semiconductor layer 306a and the microcrystalline semiconductor layer 306b; and a semiconductor layer 310 and an amorphous semiconductor layer 312 which are provided between the impurity semiconductor layer 314a and the impurity semiconductor layer 314b. The semiconductor layer 310 is provided in a similar manner to the semiconductor layer 110 and includes a plurality of crystalline regions which exist in a dispersed manner in an amorphous structure.

Further, a wiring layer 316a and a wiring layer 316b are provided over and in contact with the impurity semiconductor layer 314a and the impurity semiconductor layer 314b, respectively. Note that without limitation thereto, part of the wiring layer 316a may be in contact with parts of the semiconductor layer 310 and the amorphous semiconductor layer 312. The above-described mode is illustrated in FIG. 9B. Note that layers illustrated in FIG. 9B are the same as those illustrated in FIG. 9A as long as they are denoted by the same reference numerals as in FIG. 9A. Note that the thin film transistor illustrated in FIG. 9A can be manufactured using a multi-tone mask. In the case where a multi-tone mask is not used, the thin film transistor illustrated in FIG. 9B can be manufactured.

Figure 10A:
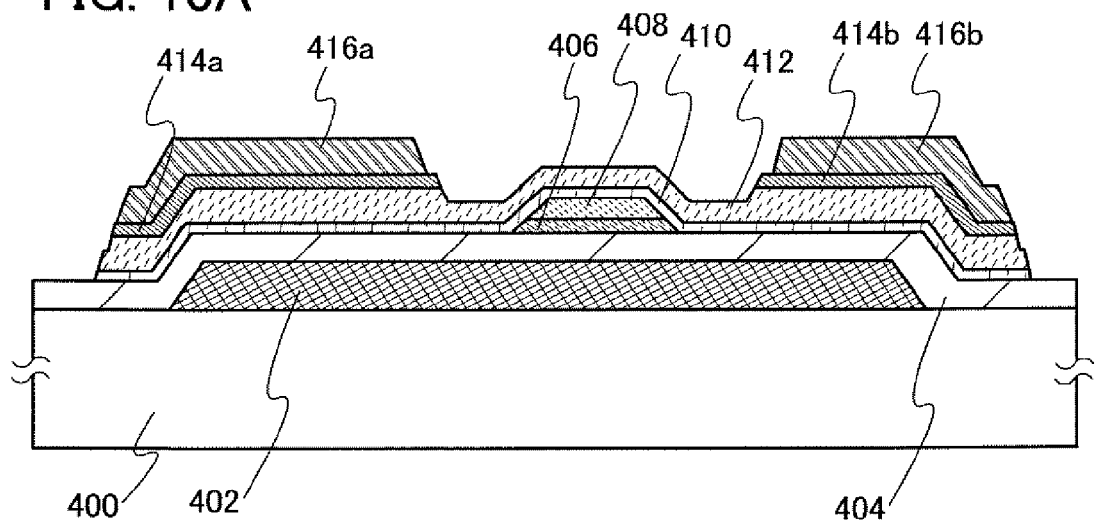
FIGS. 10A and 10B are views each illustrating an example of a structure of a thin film transistor.
Figure 10B:
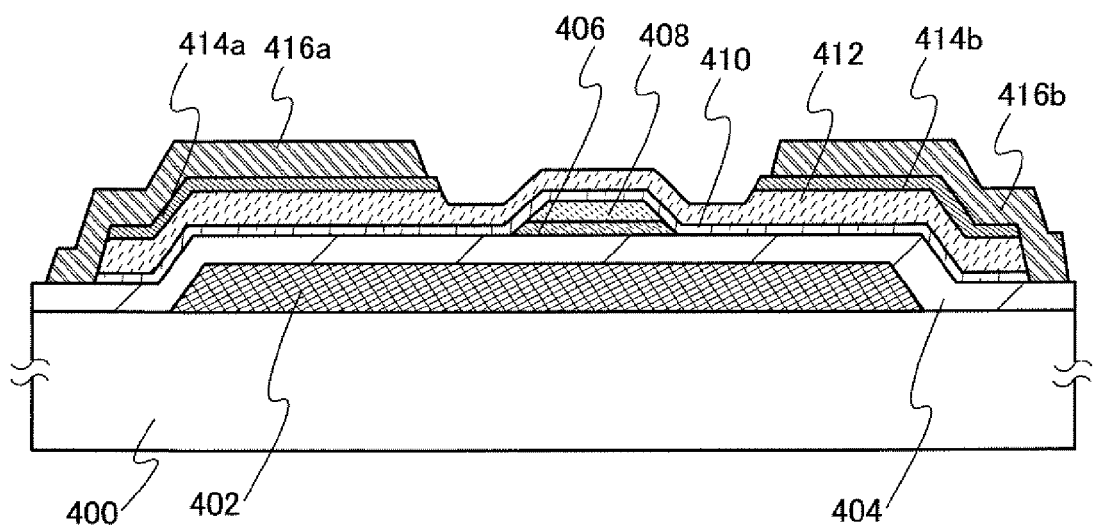

Alternatively, modes illustrated in FIGS. 10A and 10B may also be employed. A thin film transistor illustrated in FIG. 10A has a gate electrode layer 402 which is provided over a substrate 400; a gate insulating layer 404 which is provided so as to cover the gate electrode layer 402; an impurity semiconductor layer 414a and an impurity semiconductor layer 414b forming a source region and a drain region which are provided so that at least part of each of the impurity semiconductor layers 414a and 414b overlaps the gate electrode layer 402 and which are provided with a space therebetween; a microcrystalline semiconductor layer 406 which is provided over the gate insulating layer 404 in part of a channel length so that at least part of the microcrystalline semiconductor layer 406 overlaps the gate electrode layer 402 and one of the impurity semiconductor layers 414a and 414b; a buffer layer 408 which is provided over the gate insulating layer 404 so as to cover at least the microcrystalline semiconductor layer 406; and a semiconductor layer 410 and an amorphous semiconductor layer 412 which are provided between the impurity semiconductor layer 414a and the impurity semiconductor layer 414b. The semiconductor layer 410 is provided in a similar manner to the semiconductor layer 110 and includes a plurality of crystalline regions which exist in a dispersed manner in an amorphous structure.

Further, a wiring layer 416a and a wiring layer 416b are provided over and in contact with the impurity semiconductor layer 414a and the impurity semiconductor layer 414b, respectively. Note that without limitation thereto, part of the wiring layer 416a may be in contact with parts of the semiconductor layer 410 and the amorphous semiconductor layer 412. The above-described mode is illustrated in FIG. 10B. Note that layers illustrated in FIG. 10B are the same as those illustrated in FIG. 10A as long as they are denoted by the same reference numerals as in FIG. 10A. Note that the thin film transistor illustrated in FIG. 10A can be manufactured using a multi-tone mask. In the case where a multi-tone mask is not used, the thin film transistor illustrated in FIG. 10B can be manufactured.

Example

In this example, results of manufacture of the thin film transistor illustrated in FIG. 1B and measurement of the electric characteristics of the thin film transistor will be described.

First, a manufacturing process of the thin film transistor in this example will be described. In this example, the thin film transistor was manufactured without a multi-tone mask. Specifically, the thin film transistor was manufactured in the following manner: a gate electrode layer was formed over a substrate; a gate insulating layer was formed so as to cover the gate electrode layer; a microcrystalline semiconductor layer was formed over the gate insulating layer in part of a channel length so that at least part of the microcrystalline semiconductor layer overlapped the gate electrode layer; a buffer layer was formed over the microcrystalline semiconductor layer; a semiconductor layer was formed over the gate insulating layer so as to cover the microcrystalline semiconductor layer and the buffer layer; an amorphous semiconductor layer was formed over the semiconductor layer; an impurity semiconductor layer was formed over the amorphous semiconductor layer; and a wiring layer was formed over the impurity semiconductor layer so that part of the wiring layer was in contact with the impurity semiconductor layer. Then, a protective insulating layer was formed so as to cover the thin film transistor.

First, the conductive layer 132 was formed over the substrate 100. Here, a glass substrate was used as the substrate 100. Further, the conductive layer 132 with a thickness of 150 nm was formed in such a manner that a molybdenum target was sputtered in an argon atmosphere. After that the conductive layer 132 was etched using a resist mask which was formed by photolithography, whereby the gate electrode layer 102 was formed. After that, the resist mask was removed.

Next, the gate insulating layer 104, the microcrystalline semiconductor layer 136, and the buffer layer 138 were successively formed; the gate insulating layer 104 was formed over the substrate 100 so as to cover the gate electrode layer 102, and the microcrystalline semiconductor layer 136 and the buffer layer 138 were formed over the gate insulating layer 104. That is, the microcrystalline semiconductor layer 136 and the buffer layer 138 were formed without being exposed to the air after the gate insulating layer 104 and the microcrystalline semiconductor layer 136 were formed, respectively.

As the gate insulating layer 104, a silicon nitride layer with a thickness of 300 nm and a silicon oxynitride layer with a thickness of 10 nm were stacked. Here, the silicon nitride layer was first formed under such conditions that the RF power frequency was 13.56 MHz, the electric power of an RF power source was 370 W, the temperature was 280° C., the flow rate ratio of silane, hydrogen, nitrogen, and ammonia was 4:50:55:14, and the pressure was 100 Pa. Because of the formation of the silicon nitride layer, the silicon nitride layer was also formed on the inner wall of the processing chamber. After that, the silicon oxynitride layer was formed over the silicon nitride layer. Here, the silicon oxynitride layer was formed under such conditions that the RF power frequency was 13.56 MHz, the electric power of an RE power source was 50 W, the temperature was 280° C., the flow rate ratio of silane and dinitrogen monoxide was 1:140, and the pressure was 40 Pa.

Further, as the microcrystalline semiconductor layer 136, a microcrystalline silicon layer with a thickness of 20 nm, which includes a donor, was formed. The microcrystalline silicon layer here was formed under such conditions that the RF power frequency was 13.56 MHz, the electric power of an RF power source was 300 W, the temperature was 280° C., the flow rate ratio of silane, 0.5 vol % phosphine (the flow rate of $PH_3$ diluted with $H_2$ to 0.5%), and hydrogen was 1:3:150, and the pressure was 280 Pa.

Further, as the buffer layer 138, an amorphous silicon layer with a thickness of 50 nm was formed. Here, the amorphous silicon layer was formed under such conditions that the RF power frequency was 13.56 MHz, the electric power of an RF power source was 60 W, the temperature was 280° C., the flow rate ratio of silane and hydrogen was 14:15, and the pressure was 170 Pa.

After that, the microcrystalline semiconductor layer 136 and the buffer layer 138 were etched using a resist mask formed by photolithography, whereby the microcrystalline semiconductor layer 106 and the buffer layer 108 were formed. The etching step was performed with a parallel plate reactive ion etching (RIE) apparatus under such conditions that the inductively coupled plasma (ICP) power was 150 W, the bias power was 40 W, the pressure was 1.0 Pa, and chlorine was introduced into an etching gas at a flow rate of 100 sccm. After that the resist mask was removed.

Note that through the etching step, the silicon oxynitride layer remains only in a region which overlaps the microcrystalline semiconductor layer 106 and the buffer layer 108.

After the removal of the resist mask, surfaces were cleaned with fluoric acid.

Next, the semiconductor layer 140 was formed over the gate insulating layer 104 so as to cover the buffer layer 108. As the semiconductor layer 140, a silicon layer with a thickness of 30 nm was formed. Here, the silicon layer was formed under such conditions that the RF power frequency was 13.56 MHz, the electric power of an RF power source was 300 W, the temperature was 280° C., the flow rate ratio of silane and hydrogen was 1:150, and the pressure was 280 Pa. Note that the silicon layer was formed with the silicon nitride layer formed on the inner wall of the chamber, and thus the semiconductor layer 140 was formed while nitrogen existing in the inner wall of the chamber was being taken in. Since the semiconductor layer 140 is formed while the nitrogen is being taken in, the concentration of the nitrogen of the semiconductor layer 140 can be increased.

Next, the amorphous semiconductor layer 142 was formed over the semiconductor layer 140. Here, an amorphous silicon layer with a thickness of 80 nm was formed under such conditions that the RF power frequency was 13.56 MHz the electric power of an RF power source was 60 W, the temperature was 280° C., the flow rate ratio of silane and hydrogen was 14:15, and the pressure was 170 Pa.

As the impurity semiconductor layer 144, an amorphous silicon layer including phosphorus with a thickness of 50 nm was formed. Here, the amorphous silicon layer to which phosphorus was added was formed under such conditions that the RF power frequency was 13.56 MHz, the electric power of an RF power source was 60 W, the temperature was 280° C., the flow rate ratio of silane and 0.5 vol % phosphine (the flow rate of $PH_3$ diluted with $H_2$ to 0.5%) was 10:17, and the pressure was 170 Pa.

Next, after a resist was applied over the impurity semiconductor layer 144, a first resist mask was formed by photolithography, and then the semiconductor layer 140, the amorphous semiconductor layer 142, and the impurity semiconductor layer 144 were etched using the first resist mask, so that island-shaped semiconductor layers were formed. Here, the following etching conditions were employed: a parallel plate RIE apparatus was used, the ICP power was 150 W, the bias power was 40 W, the pressure was 1.0 Pa, and chlorine, the flow rate of which was 100 sccm, was used as an etching gas. After that, the first resist mask was removed.

Next, the conductive layer 146 was formed so as to cover the semiconductor layer, the amorphous semiconductor layer, and the impurity semiconductor layer which were formed and etched into the island shape in the above-described steps. Here, a molybdenum layer with a thickness of 300 nm was formed in such a manner that a molybdenum target was sputtered in an argon atmosphere.

Next, a second resist mask was formed over the conductive layer 146 by photolithography, and then the conductive layer 146 was etched using the second resist mask by wet etching, so that the wiring layer 116 was formed.

Next, the island-shaped impurity semiconductor layer was etched using the second resist mask, whereby the impurity semiconductor layer 114 was formed. Note that part of a surface of the amorphous semiconductor layer (which corresponds to a back channel portion in the thin film transistor) was also etched, whereby the amorphous semiconductor layer 112 was formed. Here, the following etching conditions were employed: a parallel plate RIE apparatus was used, the ICP power was 150 W, the bias power was 40 W, the pressure was 1.0 Pa, and chlorine, the flow rate of which was 100 sccm, was used as an etching gas. After that, the resist mask was removed. Here, the resist was removed by the water plasma treatment described in above Embodiment. Specifically, exposed parts of the amorphous semiconductor layer 112, the impurity semiconductor layer 114, and the wiring layer 116 were irradiated with radicals which were generated in such a manner that vaporized water was subjected to plasma discharge. Through this step, the exposed surface (the back channel portion) of the amorphous semiconductor layer 112 can be oxidized and dangling bonds existing on the surface (the back channel portion) of the amorphous semiconductor layer 112 can also be terminated.

Through the above-described steps, the thin film transistor was manufactured. Next, the protective insulating layer 118 was formed so as to cover the thin film transistor. Here, a silicon nitride layer with a thickness of 300 nm was formed under such conditions that the RF power frequency was 13.56 MHz, the electric power of an RF power source was 150 W, the temperature was 280° C., the flow rate ratio of silane, ammonia, nitrogen, and hydrogen was 2:22:45:45, and the pressure was 160 Pa.

Next, part of the protective insulating layer 118 was etched by dry etching, using a resist mask formed over the protective insulating layer 118 by photolithography, whereby part of the wiring layer 116 was exposed. Here, parts of the protective insulating layer 118 and the gate insulating layer 104 were etched by dry etching, whereby part of the gate electrode layer 102 was exposed. Here, the parts of the protective insulating layer 118 and the gate insulating layer 104 were etched using a parallel plate RIP apparatus under such conditions that the ICP power was 475 W, the bias power was 300 W, the pressure was 5.5 Pa, plasma was generated using a mixed gas of $CHF_3$, the flow rate of which was 50 sccm, and helium, the flow rate of which was 100 sccm, and then $CHF_3$, the flow rate of which was 7.5 sccm and helium, the flow rate of which was 142.5 sccm were used as an etching gas. After that, the resist mask was removed.

Through the above-described steps, the thin film transistor which can be used as a pixel transistor was manufactured. The measurement results of the electric characteristics of the thin film transistor will be described.

Note that the thin film transistor of this example was manufactured so as to have a channel length L (see FIG. 1B) of 10 μm, a channel width of 20 μm, and a channel length b of a second thin film transistor (see FIG. 1B) of 2 μm.

Figure 8:
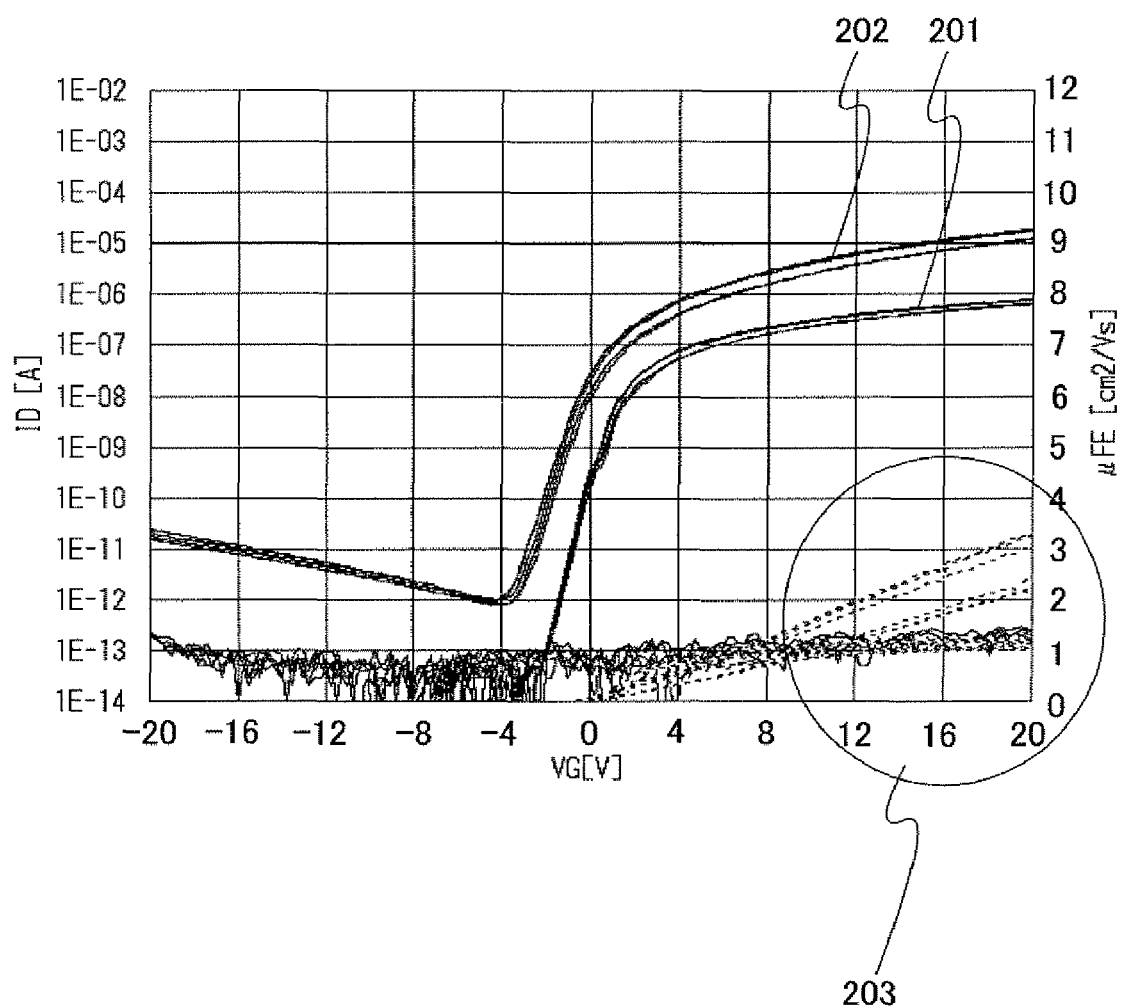
FIG. 8 is a graph illustrating Example.

FIG. 8 shows current-voltage characteristics (drain current with respect to gate voltage) and field effect mobility of the thin film transistor manufactured in the above-described manner. Note that a curve 201 and a curve 202 indicate current-voltage characteristics when the drain voltages were 1 V and 14 V, respectively. Further, as indicated by a region 203, the maximum field effect mobility was greater than or equal to 3.0 cm$^2$/V·s. Further, on current at a gate voltage of 20 V was about $1\times10^{-6}$ A or more, and off current at a gate voltage of −20 V was less than or equal to $1\times10^{-10}$ A. Accordingly, it was found that the thin film transistor having high on current and low off current could be manufactured.

Note that in the manufacture of the thin film transistor in this example, the thin film transistor was manufactured without performing dry etching described in Embodiment, which is performed for the purpose of removing an etching residue or the like in the back channel portion after removing the second resist mask. Thus, it can be considered that the dry etching step is additionally performed in the manufacture of the thin film transistor of this example, so that the thin film transistor can have further reduced off current, and thus switching characteristics of the thin film transistor can be further improved.

This application is based on Japanese Patent Application serial no. 2008-115357 filed with Japan Patent Office on Apr. 25, 2008, the entire contents of which are hereby incorporated by reference.

What is claimed is:

1. A semiconductor device comprising:
   a gate insulating layer over a gate electrode layer;
   a microcrystalline semiconductor layer which is on and in direct contact with the gate insulating layer and overlaps the gate electrode layer;
   a semiconductor layer over and in direct contact with the gate insulating layer so as to cover the microcrystalline semiconductor layer;
   an amorphous semiconductor layer on and in direct contact with the semiconductor layer; and
   a pair of impurity semiconductor layers forming a source region and a drain region, on and in direct contact with the amorphous semiconductor layer,
   wherein at least part of each of the pair of impurity semiconductor layers overlaps the gate electrode layer,
   wherein at least part of the microcrystalline semiconductor layer is provided in part of a channel, and
   wherein the semiconductor layer includes a plurality of crystalline regions existing in a dispersed manner in an amorphous structure.

2. The semiconductor device according to claim 1, wherein the microcrystalline semiconductor layer contains phosphorus.

3. The semiconductor device according to claim 1, wherein at least one of the plurality of crystalline regions has a grain with an inverted-conical or inverted-pyramidal structure, growing substantially radially in a direction in which the semiconductor layer is deposited, from a position away from an interface between the gate insulating layer and the semiconductor layer, in a region not reaching the pair of impurity semiconductor layers.

4. The semiconductor device according to claim 1,
   wherein the semiconductor layer contains, in the vicinity of an interface with the gate insulating layer, a first impurity element reducing a coordination number of a semiconductor and generating dangling bonds and a second impurity element generating dangling bonds less easily than the first impurity element, and
   wherein a concentration of the first impurity element is smaller than that of the second impurity element by one digit.

5. The semiconductor device according to claim 4, wherein the first impurity element is oxygen and the second impurity element is nitrogen.

6. The semiconductor device according to claim 5, wherein the concentration of nitrogen in the semiconductor layer decreases monotonously from a first side in direct contact with the gate insulating layer to a second side in direct contact with the amorphous semiconductor layer.

7. The semiconductor device according to claim 1, wherein the amorphous semiconductor layer is an amorphous silicon layer.

8. A semiconductor device comprising:
   a gate insulating layer over a gate electrode layer;
   a microcrystalline semiconductor layer which is on and in direct contact with the gate insulating layer and overlaps the gate electrode layer;
   a semiconductor layer over and in direct contact with the gate insulating layer so as to cover the microcrystalline semiconductor layer;
   an amorphous semiconductor layer on and in direct contact with the semiconductor layer; and
   a pair of impurity semiconductor layers forming a source region and a drain region, on and in direct contact with the amorphous semiconductor layer,
   wherein at least part of each of the pair of impurity semiconductor layers overlaps the gate electrode layer,
   wherein at least part of the microcrystalline semiconductor layer is provided in part of a channel,
   wherein one of the pair of impurity semiconductor layers overlaps the microcrystalline semiconductor layer, and
   wherein the semiconductor layer includes a plurality of crystalline regions existing in a dispersed manner in an amorphous structure.

9. The semiconductor device according to claim 8, wherein the microcrystalline semiconductor layer contains phosphorus.

10. The semiconductor device according to claim 8, wherein each of the plurality of crystalline regions has a grain with an inverted-conical or inverted-pyramidal structure, growing substantially radially in a direction in which the semiconductor layer is deposited, from a position away from an interface between the gate insulating layer and the semiconductor layer, in a region not reaching the pair of impurity semiconductor layers.

11. The semiconductor device according to claim 8,
wherein the semiconductor layer contains, in the vicinity of an interface with the gate insulating layer, a first impurity element reducing a coordination number of a semiconductor and generating dangling bonds and a second impurity element generating dangling bonds less easily than the first impurity element, and
wherein a concentration of the first impurity element is smaller than that of the second impurity element by one digit.

12. The semiconductor device according to claim 11, wherein the first impurity element is oxygen and the second impurity element is nitrogen.

13. The semiconductor device according to claim 12, wherein the concentration of nitrogen in the semiconductor layer decreases monotonously from a first side in direct contact with the gate insulating layer to a second side in direct contact with the amorphous semiconductor layer.

14. The semiconductor device according to claim 8, wherein the amorphous semiconductor layer is an amorphous silicon layer.

15. A semiconductor device comprising:
a gate insulating layer over a gate electrode layer;
microcrystalline semiconductor layers which are on and in direct contact with the gate insulating layer and overlap the gate electrode layer;
a semiconductor layer over and in direct contact with the gate insulating layer so as to cover the microcrystalline semiconductor layers;
an amorphous semiconductor layer on and in direct contact with the semiconductor layer;
a pair of impurity semiconductor layers forming a source region and a drain region, on and in direct contact with the amorphous semiconductor layer,
wherein at least part of each of the pair of impurity semiconductor layers overlaps the gate electrode layer,
wherein at least parts of the microcrystalline semiconductor layers are provided in part of a channel,
wherein the semiconductor layer includes a plurality of crystalline regions existing in a dispersed manner in an amorphous structure.

16. The semiconductor device according to claim 15, wherein each of the microcrystalline semiconductor layers contains phosphorus.

17. The semiconductor device according to claim 15, wherein each of the plurality of crystalline regions has a grain with an inverted-conical or inverted-pyramidal structure, growing substantially radially in a direction in which the semiconductor layer is deposited, from a position away from an interface between the gate insulating layer and the semiconductor layer, in a region not reaching the pair of impurity semiconductor layers.

18. The semiconductor device according to claim 15,
wherein the semiconductor layer contains, in the vicinity of an interface with the gate insulating layer, a first impurity element reducing a coordination number of a semiconductor and generating dangling bonds and a second impurity element generating dangling bonds less easily than the first impurity element, and
wherein a concentration of the first impurity element is smaller than that of the second impurity element by one digit.

19. The semiconductor device according to claim 18, wherein the first impurity element is oxygen and the second impurity element is nitrogen.

20. The semiconductor device according to claim 19, wherein the concentration of nitrogen in the semiconductor layer decreases monotonously from a first side in direct contact with the gate insulating layer to a second side in direct contact with the amorphous semiconductor layer.

21. The semiconductor device according to claim 15, wherein the amorphous semiconductor layer is an amorphous silicon layer.

22. A semiconductor device comprising:
a gate insulating layer over a gate electrode layer;
a microcrystalline semiconductor layer which is on and in direct contact with the gate insulating layer and overlaps the gate electrode layer;
a semiconductor layer over and in direct contact with the gate insulating layer so as to cover the microcrystalline semiconductor layer,
an amorphous semiconductor layer on and in direct contact with the semiconductor layer; and
a pair of impurity semiconductor layers forming a source region and a drain region, on and in direct contact with the amorphous semiconductor layer,
wherein at least part of each of the pair of impurity semiconductor layers overlaps the gate electrode layer,
wherein one of the pair of impurity semiconductor layers overlaps the microcrystalline semiconductor layer and the other impurity semiconductor layer does not overlap the microcrystalline semiconductor layer,
wherein at least part of the microcrystalline semiconductor layer is provided in part of a channel, and
wherein the semiconductor layer includes a plurality of crystalline regions existing in a dispersed manner in an amorphous structure.

23. The semiconductor device according to claim 22, wherein the microcrystalline semiconductor layer contains phosphorus.

24. The semiconductor device according to claim 22, wherein each of the plurality of crystalline regions has a grain with an inverted-conical or inverted-pyramidal structure, growing substantially radially in a direction in which the semiconductor layer is deposited, from a position away from an interface between the gate insulating layer and the semiconductor layer, in a region not reaching the pair of impurity semiconductor layers.

25. The semiconductor device according to claim 22,
wherein the semiconductor layer contains, in the vicinity of an interface with the gate insulating layer, a first impurity element reducing a coordination number of a semiconductor and generating dangling bonds and a second impurity element generating dangling bonds less easily than the first impurity element, and wherein a concentration of the first impurity element is smaller than that of the second impurity element by one digit.

26. The semiconductor device according to claim 25, wherein the first impurity element is oxygen and the second impurity element is nitrogen.

27. The semiconductor device according to claim 26, wherein the concentration of nitrogen in the semiconductor layer decreases monotonously from a first side in direct contact with the gate insulating layer to a second side in direct contact with the amorphous semiconductor layer.

28. The semiconductor device according to claim 22, wherein the amorphous semiconductor layer is an amorphous silicon layer.

* * * * *

UNITED STATES PATENT AND TRADEMARK OFFICE
CERTIFICATE OF CORRECTION

| | | |
|---|---|---|
| PATENT NO. | : 8,049,215 B2 | |
| APPLICATION NO. | : 12/426983 | |
| DATED | : November 1, 2011 | |
| INVENTOR(S) | : Yasuhiro Jinbo et al. | |

It is certified that error appears in the above-identified patent and that said Letters Patent is hereby corrected as shown below:

Column 4, line 66, "semiconductor layer," should be "semiconductor layer."

Column 5, line 24, "$10^{-7}$ S.cm$^{-1}$ to 104" should read "$10^{-7}$ S.cm$^{-1}$ to $10^{-4}$"

Column 5, line 47, "film transistor is of)." should read "film transistor is off)."

Column 8, line 12, "a multi-one mask" should read "a multi-tone mask"

Column 13, line 64, "a hack channel of the impurity" should read "a back channel of impurity"

Column 15, line 9, "Next a microcrystalline" should read "Next, a microcrystalline"

Column 15, line 22, "phosphorus, arsenic antimony" should read "phosphorus, arsenic, antimony"

Column 20, line 40, "a flow rate of NH$_3$ of 140 seem" should read "a flow rate of NH$_3$ of 140 sccm"

Column 20, line 52, "and the 112 gas is not necessarily introduced." should read "and the H$_2$ gas is not necessarily introduced."

Column 23, line 64, "a halftone mask 175." should read "a half-tone mask 175."

Column 28, line 61, "After that the" should read "After that, the"

Column 29, line 22, "the electric power of an RE power source" should be "the electric power of an RF power source"

Column 30, line 8, "RF power frequency was 13.56 MHz the" should read "RF power frequency was 13.56 MHz, the"

Signed and Sealed this
Fourteenth Day of February, 2012

David J. Kappos
*Director of the United States Patent and Trademark Office*

Column 31, line 16, "using a parallel plate RIP apparatus" should read "using a parallel plate RIE apparatus"